United States Patent
Kim

(10) Patent No.: US 11,373,709 B2
(45) Date of Patent: *Jun. 28, 2022

(54) MEMORY SYSTEM FOR PERFORMING A READ OPERATION AND AN OPERATING METHOD THEREOF

(71) Applicant: SK hynix Inc., Gyeonggi-do (KR)

(72) Inventor: Dae Sung Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 33 days.

This patent is subject to a terminal disclaimer.

(21) Appl. No.: 16/928,216

(22) Filed: Jul. 14, 2020

(65) Prior Publication Data

US 2021/0264986 A1    Aug. 26, 2021

(30) Foreign Application Priority Data

Feb. 26, 2020   (KR) .......................... 10-2020-0023653

(51) Int. Cl.
*G11C 16/16*   (2006.01)
*G11C 16/26*   (2006.01)

(52) U.S. Cl.
CPC ............. *G11C 16/16* (2013.01); *G11C 16/26* (2013.01)

(58) Field of Classification Search
CPC ..... G11C 16/0483; G11C 16/16; G11C 16/26; G11C 2216/22
USPC ............. 365/230.03, 185.02, 185.11, 185.17
See application file for complete search history.

(56) References Cited

U.S. PATENT DOCUMENTS

2016/0210083 A1 * 7/2016 Oh ........................ G06F 3/0616

FOREIGN PATENT DOCUMENTS

KR    10-2018-0087322    8/2018

* cited by examiner

*Primary Examiner* — Alfredo Bermudez Lozada
(74) *Attorney, Agent, or Firm* — IP & T Group LLP

(57) ABSTRACT

A memory system includes a memory device including a plane including a plurality of memory blocks, each memory block including a plurality of memory cells, each memory cell capable of storing multi-bit data, and a controller configured to determine that a second memory block is a candidate block when an issue-triggering operation is performed for a first memory block, adjust levels of read voltages when receiving a read command for data stored in the second memory block determined as the candidate block, and control the memory device to supply adjusted levels of the read voltages to the second memory block to perform a read operation corresponding to the read command. The second memory block and the first memory block are included in the same plane. The issue-triggering operation includes either a program operation or an erase operation.

18 Claims, 13 Drawing Sheets

FIG. 10

|  | #PE_CYCLE < TH1 | #PE_CYCLE ≥ TH1 |
|---|---|---|
| R1 | DELTA1 | DELTA'1 |
| R2 | DELTA2 | DELTA'2 |
| R3 | DELTA3 | DELTA'3 |
| R4 | DELTA4 | DELTA'4 |
| R5 | DELTA5 | DELTA'5 |
| R6 | DELTA6 | DELTA'6 |
| R7 | DELTA7 | DELTA'7 |

| | #PE_CYCLE < TH1 | #PE_CYCLE ≥ TH1 |
|---|---|---|
| R1 | $DELTA1 - \left[\dfrac{\#PE\_CYCLE}{TH11}\right]$ | $DELTA'1 - \left[\dfrac{\#PE\_CYCLE}{TH11'}\right]$ |
| R2 | $DELTA2 - \left[\dfrac{\#PE\_CYCLE}{TH22}\right]$ | $DELTA'2 - \left[\dfrac{\#PE\_CYCLE}{TH22'}\right]$ |
| R3 | $DELTA3 - \left[\dfrac{\#PE\_CYCLE}{TH33}\right]$ | $DELTA'3 - \left[\dfrac{\#PE\_CYCLE}{TH33'}\right]$ |
| R4 | $DELTA4 - \left[\dfrac{\#PE\_CYCLE}{TH44}\right]$ | $DELTA'4 - \left[\dfrac{\#PE\_CYCLE}{TH44'}\right]$ |
| R5 | $DELTA5 - \left[\dfrac{\#PE\_CYCLE}{TH55}\right]$ | $DELTA'5 - \left[\dfrac{\#PE\_CYCLE}{TH55'}\right]$ |
| R6 | $DELTA6 - \left[\dfrac{\#PE\_CYCLE}{TH66}\right]$ | $DELTA'6 - \left[\dfrac{\#PE\_CYCLE}{TH66'}\right]$ |
| R7 | $DELTA7 - \left[\dfrac{\#PE\_CYCLE}{TH77}\right]$ | $DELTA'7 - \left[\dfrac{\#PE\_CYCLE}{TH77'}\right]$ |

FIG. 12

| PLANEi | BLKi | FLAG_BIT |
|---|---|---|
| PLANE0 | BLK1 | 0 |
| | BLK2 | 1 |
| | ⋮ | ⋮ |
| | BLK10 | 1 |
| | BLK11 | 1 |
| | BLK12 | 1 |

FIG. 13

| PLANEi | BLKi | FLAG_BIT |
|---|---|---|
| PLANE0 | BLK1 | 0 |
| | BLK2 | 0 |
| | ⋮ | ⋮ |
| | BLK10 | 1 |
| | BLK11 | 1 |
| | BLK12 | 1 |

MEMORY SYSTEM FOR PERFORMING A READ OPERATION AND AN OPERATING METHOD THEREOF

CROSS-REFERENCE TO RELATED APPLICATION

This patent application claims priority to Korean Patent Application No. 10-2020-0023653, filed on Feb. 26, 2020, the entire disclosure of which is incorporated herein by reference.

TECHNICAL FIELD

An embodiment of this disclosure relates to a memory system including a non-volatile memory device and a method of operating the memory system.

BACKGROUND

The computer environment paradigm has moved to ubiquitous computing systems that can support computer system access anytime and anywhere. As a result, use of portable electronic devices (e.g., mobile phones, digital cameras, notebook computers) has rapidly increased. These portable electronic devices generally use a memory system having one or more memory devices for storing data. The memory system may serve as a main storage device or an auxiliary storage device.

Data storage devices that use non-volatile semiconductor memories demonstrate several advantages over hard disks. For example, data storage devices that use non-volatile semiconductor memories do not have mechanical driving parts (e.g., mechanical arms) and thus may exhibit improved performance in terms of stability and durability. These data storage devices may also achieve faster data access speeds and may consume comparatively less power. Examples of data storage devices that are able to achieve these performance improvements include, but are not limited to, Universal Serial Bus (USB)-type memory devices, memory cards having various interfaces, and solid state drives (SSDs).

SUMMARY

One or more embodiments described herein provide a memory system, a data processing system, and an operation process or method which can quickly and reliably process data into a memory device by reducing operational complexity and performance degradation, which, in turn, may enhance usage efficiency of the memory device.

One or more embodiments described herein also provide a method and an apparatus for adjusting the level of a read voltage based on a preset table and a calculation. The read voltage may then be used to perform a read operation, so that a chance of success regarding the read operation can be increased.

In an embodiment, a memory system can include a memory device including a plane that includes a plurality of memory blocks, each memory block including a plurality of memory cells, each memory cell capable of storing multi-bit data; and a controller configured to determine that a second memory block is a candidate block when an issue-triggering operation is performed for a first memory block, to adjust levels of read voltages when receiving a read command associated for data stored in the second memory block determined as the candidate block, and to control the memory device to supply adjusted levels of the read voltages to the second memory block to perform a read operation corresponding to the read command. The second memory block and the first memory block are included in the same plane. The issue-triggering operation can include either a program operation or an erase operation.

The controller can be configured to adjust the levels of the read voltages based on a set table. The set table includes information indicative of how much the levels of the read voltages can be individually changed from default values of the read voltages.

The adjusted levels of the read voltages can be individually obtained by adding changes determined based on the set table and the default values of the read voltages.

The adjusted levels of the read voltages can be obtained by adding changes, individually determined based on the set table and a calculation result, to the default values of the read voltages.

The controller can be configured to perform a Gaussian function based on a value obtained by dividing a program/erase cycle regarding the second memory block by a threshold established for the second memory block to obtain the calculation result.

The second memory block can be exempted from the plurality of memory blocks determined as the candidate block.

The controller can determine whether the second memory block is the candidate block based on a flag bit which is associated with the second memory block and which has a first logical value.

The controller can determine a flag bit for the second memory block as a second logical value to exempt the second memory block as the candidate block.

The controller can be configured to control the memory device to perform a read retry operation when the read operation is failed.

The controller can be configured to control the memory device to supply default levels of the read voltages to a memory block associated with another read command to perform a read operation corresponding to the read command.

In another embodiment, a method for operating a memory system can include performing an issue-triggering operation for a first memory block among a plurality of memory blocks, each of the plurality of memory blocks including a plurality of memory cells, each memory cell capable of storing multi-bit data; determining that a second memory block other than the first memory block among the plurality of memory blocks in the same plane is a candidate block; receiving a read command associated for data stored in a second memory block determined as the candidate block; adjusting levels of read voltages which are applicable to the second memory block; and controlling the memory device to supply adjusted levels of the read voltages to the second memory block for performing a read operation corresponding to the read command. The issue-triggering operation can include either a program operation or an erase operation.

The method can further include adjusting the levels of the read voltages based on a set table. The set table can include information indicative of how much the levels of the read voltages are individually changed from default values of the read voltages.

The adjusting the levels of read voltages can include adding changes determined based on the set table to the default values of the read voltages, individually.

The adjusting the levels of read voltages can include adding changes, individually determined based on the set table and a calculation result, to the default values of the read voltages.

The adjusting the levels of read voltages can include performing a Gaussian function based on a value of dividing a program/erase cycle regarding the second memory block by a threshold established for the second memory block to obtain the calculation result.

The method can further include exempting the second memory block from the plurality of memory blocks determined as the candidate block.

The determining that the memory block other than the first memory block among the plurality of memory blocks is the candidate block can include determining whether the second memory block is the candidate block based on a flag bit which is associated with the second memory block and which has a first logical value.

The exempting the second memory block can include determining that a flag bit for the second memory block has a second logical value to exempt the second memory block from the candidate block.

The method can further include controlling the memory device to perform a read retry operation when the read operation fails.

The method can further include controlling the memory device to supply default levels of the read voltages to a memory block associated with another read command for performing a read operation corresponding to the read command.

In another embodiment, a system can include a signal line coupled to a memory device which includes at least one plane with a plurality of memory blocks; and a controller configured to control the memory device based on signals transmitted through the signal line, the controller to determine that a second memory block of the plurality of memory blocks is a candidate block when an issue-triggering operation is performed in a first memory block, to adjust a level of at least one read voltage based on a read command for data stored in the second memory block determined as the candidate block, and to control the memory device to supply the adjusted level of the at least one read voltage to the second memory block, wherein the second memory block is different from the first memory block of the plurality of memory blocks and wherein the issue-triggering operation includes a program operation or an erase operation.

BRIEF DESCRIPTION OF THE DRAWINGS

The description herein makes reference to the accompanying drawings wherein like reference numerals refer to like parts throughout the figures.

FIG. 10 illustrates a table according to an embodiment.

FIG. 11 illustrates changing or adjusting the levels of read voltages according to an embodiment.

FIG. 12 illustrates a method for determining whether a memory block is a candidate block according to an embodiment.

FIG. 13 illustrates examples of flag bits, at least one of which may be changed after a memory block is exempted from a candidate block.

Figure 1:
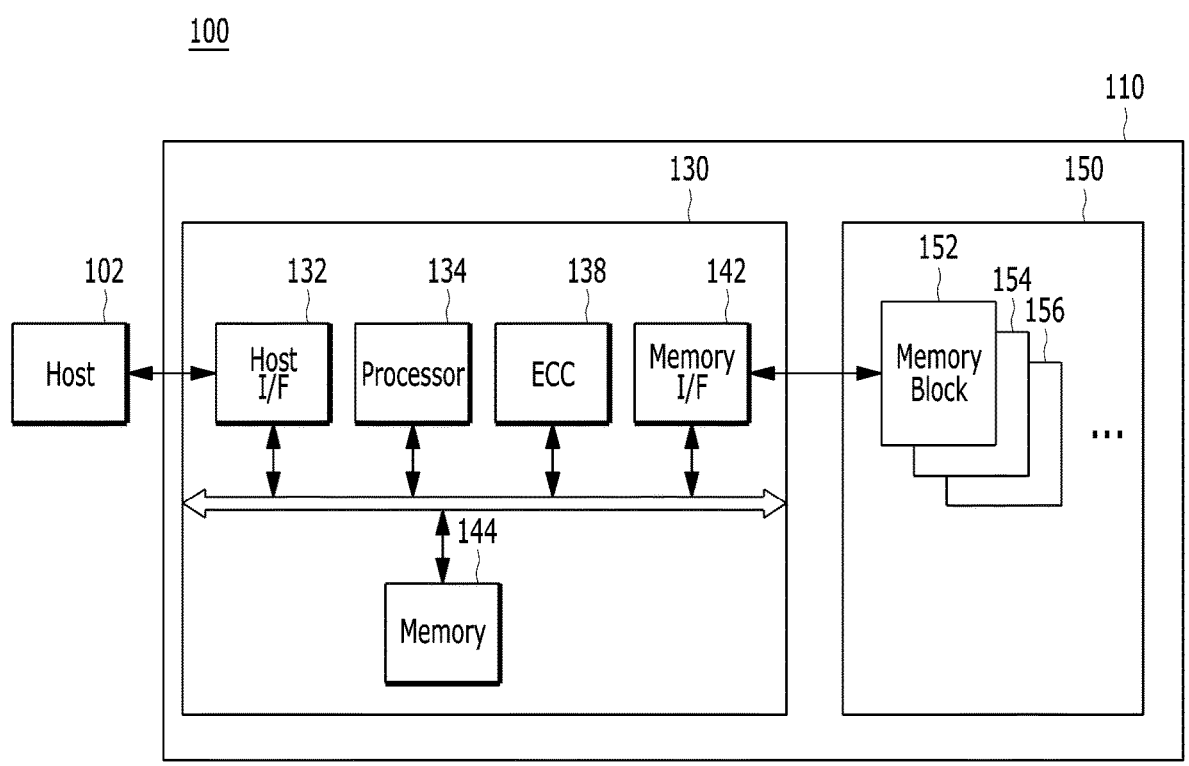
FIG. 1 illustrates a data processing system including a memory system according to an embodiment.

In this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

DETAILED DESCRIPTION

Various embodiments of the disclosure are described below with reference to the accompanying drawings. Elements and features of the disclosure, however, may be configured or arranged differently to form other embodiments, which may be variations of any of the disclosed embodiments.

In this disclosure, the terms "comprise," "comprising," "include," and "including" are open-ended. As used in the appended claims, these terms specify the presence of the stated elements and do not preclude the presence or addition of one or more other elements. The terms in a claim does not foreclose the apparatus from including additional components (e.g., an interface unit, circuitry, etc.).

In this disclosure, various units, circuits, or other components may be described or claimed as "configured to" perform a task or tasks. In such contexts, "configured to" is used to connote structure by indicating that the blocks/units/circuits/components include structure (e.g., circuitry) that performs one or more tasks during operation. As such, the block/unit/circuit/component can be said to be configured to perform a task even when the blocks/unit/circuit/component is not currently operational (e.g., is not on). The block/unit/circuit/component used with the "configured to" language include hardware, for example, a circuit, memory storing program instructions executable to implement the operation, etc. Reciting that a block/unit/circuit/component is "configured to" perform one or more tasks is expressly intended not to invoke 35 U.S.C. § 112, sixth paragraph, for an interpretation of the block/unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks.

As used in the disclosure, the term 'circuitry' refers to all of the following: (a) hardware-only circuit implementations (such as implementations in only analog and/or digital circuitry) and (b) combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions) and (c) circuits, such as a microprocessor(s) or a portion of a microprocessor(s), that require software or firmware for operation, even if the software or firmware is not physically present. This definition of 'circuitry' applies to all uses of this term in this application, including in any claims. As a further example, as used in this application, the term "circuitry" also covers an implementation of merely a processor (or multiple processors) or portion of a processor and its (or their) accompanying software and/or firmware. The term "circuitry" also covers, for example, and if applicable to a particular claim element, an integrated circuit for a storage device.

As used herein, these terms "first," "second," "third," and so on are used as labels for nouns that they precede, and do not imply any type of ordering (e.g., spatial, temporal, logical, etc.). The terms "first" and "second" do not necessarily imply that the first value must be written before the second value. Further, although the terms may be used herein to identify various elements, these elements are not limited by these terms. These terms are used to distinguish one element from another element that otherwise have the same or similar names. For example, a first circuitry may be distinguished from a second circuitry.

Further, the term "based on" is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects determination of A, such a phrase does not foreclose determination of A from also being based on C. In other instances, A may be determined based solely on B.

FIG. 1 illustrates a data processing system 100 including a memory system according to an embodiment. Referring to FIG. 1, the data processing system 100 may include a host 102 engaged, operatively coupled, or interlocked with a memory system 110.

The host 102 may include, for example, a portable electronic device (e.g., a mobile phone, an MP3 player, a laptop computer) or a non-portable electronic device (e.g., a desktop computer, a game player, a television, a projector). The host 102 may also include at least one operating system (OS) which manages and controls functions and operations of the host 102. The OS can provide interoperability between the host 102 engaged with the memory system 110 and the user using the memory system 110. In one embodiment, the OS may support functions and operations corresponding to user requests.

By the way of example but not limitation, the OS can be classified into a general operating system and a mobile operating system according to mobility of the host 102. The general operating system may be classified into a personal operating system and an enterprise operating system according to system requirements or a user environment. The enterprise operating system can be specialized for securing and supporting high performance computing. The mobile operating system may be subject to support services or functions for mobility (e.g., a power saving function). In one embodiment, the host 102 may include a plurality of operating systems. For example, the host 102 may execute multiple operating systems interlocked with the memory system 110 corresponding to a user request. The host 102 may transmit a plurality of commands corresponding to user requests into the memory system 110, thereby performing operations corresponding to commands within the memory system 110.

The controller 130 in the memory system 110 may control the memory device 150 in response to a request or a command input from the host 102. For example, the controller 130 may perform a read operation to provide data read from the memory device 150 for the host 102, and perform a write operation (or a program operation) to store data input from the host 102 in the memory device 150. In order to perform data input/output (I/O) operations, the controller 130 may control and manage internal operations for data read, data program, data erase, or the like.

According to an embodiment, the controller 130 can include a host interface 132, a processor 134, error correction circuitry 138, a power management unit (PMU) 140, a memory interface 142, and a memory 144. Components in the controller 130 illustrated in FIG. 1 may vary among embodiments, operation performance requirements, and/or the like regarding the memory system 110. For example, the memory system 110 may be implemented with any of various types of storage devices, which may be electrically coupled with the host 102, according to a protocol of a host interface. Non-limiting examples of suitable storage devices include a solid state drive (SSD), a multimedia card (MMC), an embedded MMC (eMMC), a reduced size MMC (RS-MMC), a micro-MMC, a secure digital (SD) card, a mini-SD, a micro-SD, a universal serial bus (USB) storage device, a universal flash storage (UFS) device, a compact flash (CF) card, a smart media (SM) card, a memory stick, and the like. Components in the controller 130 may be added or omitted based at implementation of the memory system 110.

The host 102 and the memory system 110 may include a controller or an interface for transmitting and receiving signals, data, and/or other information based on a set protocol. For example, the host interface 132 in the memory system 110 may include an apparatus capable of transmitting signals, data, and/or other forms of information to the host 102 or for receiving signals, data, and/or other forms of information input from the host 102.

The host interface 132 in the controller 130 may receive signals, commands (or requests), or data from the host 102. For example, the host 102 and the memory system 110 may use a set protocol to transmit and receive data between each other. An example of protocols or interfaces that may be supported by the host 102 and the memory system 110 for sending and receiving data include Universal Serial Bus (USB), Multi-Media Card (MMC), Parallel Advanced Technology Attachment (PATA), Small Computer System Interface (SCSI), Enhanced Small Disk Interface (ESDI), Integrated Drive Electronics (IDE), Peripheral Component Interconnect Express (PCIE), Serial-attached SCSI (SAS), Serial Advanced Technology Attachment (SATA), Mobile Industry Processor Interface (MIPI), and the like. According to an embodiment, the host interface 132 may be a kind of layer configured to exchange data with the host 102 and may be implemented with, or driven by, firmware or other instructions called a host interface layer (HIL).

The Integrated Drive Electronics (IDE) or Advanced Technology Attachment (ATA) may be used as an interface for transmitting and receiving data and can use a cable including 40 wires connected in parallel in order to support data transmission and reception between the host 102 and the memory system 110. When a plurality of memory systems 110 are connected to a single host 102, the plurality of memory systems 110 may be divided into a master and a slave using, for example, a position or a dip switch that switches the plurality of memory systems 110. The memory system 110 set as the master may be used as the main memory device. Examples of the IDE (ATA) or evolutions of ADE (ATA) include Fast-ATA, ATAPI, and Enhanced IDE (EIDE).

Serial Advanced Technology Attachment (SATA) is a kind of serial data communication interface compatible with various ATA standards of parallel data communication interfaces which is used by Integrated Drive Electronics (IDE) devices. The 40 wires in the IDE interface can be reduced to six wires in the SATA interface. For example, 40 parallel signals for the IDE can be converted into 6 serial signals for the SATA to be transmitted between each other. The SATA interface has been widely used because of its faster data transmission and reception rate and its less resource consumption in the host 102 used for data transmission and reception. The SATA interface may support connection with up to 30 external devices to a single transceiver included in the host 102.

In addition, SATA can support hot plugging that allows an external device to be attached or detached from the host 102 even while data communication between the host 102 and another device is being executed. Thus, the memory system 110 can be connected or disconnected as an additional device, like a device supported by a universal serial bus (USB), even when the host 102 is powered on. For example, in the host 102 having an eSATA port, the memory system 110 may be freely detached like an external hard disk.

The Small Computer System Interface (SCSI) is a kind of serial data communication interface used for connection between a computer, a server, and/or another peripheral device. SCSI can provide a high transmission speed, as compared with other interfaces such as the IDE and the SATA. In SCSI, the host 102 and at least one peripheral device (e.g., memory system 110) may be connected in series, but data transmission and reception between the host 102 and each peripheral device may be performed through a parallel data communication. In SCSI, it is easy to connect the host 102 to, or disconnect the host 102 from, the memory system 110. Additionally, SCSI can support connections of 15 other devices to a single transceiver in host 102.

Serial Attached SCSI (SAS) can be understood as a serial data communication version of the SCSI. In SAS, not only the host 102 and a plurality of peripheral devices are connected in series, but also data transmission and reception between the host 102 and each peripheral device may be performed in a serial data communication scheme. The SAS can support connection between the host 102 and the peripheral device through a serial cable instead of a parallel cable, so as to easily manage equipment using the SAS and enhance or improve operational reliability and communication performance. SAS may support connections of eight external devices to a single transceiver in host 102.

Non-volatile memory express (NVMe) is a kind of interface based at least on a Peripheral Component Interconnect Express (PCIe) designed to increase performance and design flexibility of the host 102, servers, computing devices, and the like, equipped with the non-volatile memory system 110. PCIe can use a slot or a specific cable for connecting the host 102 (e.g., a computing device) and the memory system 110 (e.g., a peripheral device). For example, PCIe can use a plurality of pins (for example, 18 pins, 32 pins, 49 pins, 82 pins, etc.) and at least one wire (e.g. ×1, ×4, ×8, ×16, etc.), to achieve high speed data communication over several hundred MB per second (e.g. 250 MB/s, 500 MB/s, 984.6250 MB/s, 1969 MB/s, and etc.). According to an embodiment, the PCIe scheme may achieve bandwidths of tens to hundreds of Giga bits per second. A system using the NVMe can make the most of an operation speed of the non-volatile memory system 110 (e.g., SSD) which operates at a higher speed than a hard disk.

According to an embodiment, the host 102 and the memory system 110 may be connected through a Universal Serial Bus (USB). A USB is a kind of scalable, hot-pluggable plug-and-play serial interface that can provide cost-effective standard connectivity between the host 102 and a peripheral device, such as a keyboard, a mouse, a joystick, a printer, a scanner, a storage device, a modem, a video camera, and the like. A plurality of peripheral devices such as the memory system 110 may be coupled to a single transceiver included in the host 102.

Referring to FIG. 1, the error correction circuitry 138 can correct error bits of the data to be processed in (e.g., output from) the memory device 150, which may include an error correction code (ECC) encoder and an ECC decoder. Here, the ECC encoder can perform error correction encoding of data to be programmed in the memory device 150, in order to generate encoded data into which a parity bit is added for storage in memory device 150. The ECC decoder can detect and correct errors contained in data read from the memory device 150 when the controller 130 reads the data stored in the memory device 150. For example, after performing error correction decoding on the data read from the memory device 150, the error correction circuitry 138 can determine whether the error correction decoding has succeeded and output an instruction signal (e.g., a correction success signal or a correction fail signal). The error correction circuitry 138 can use the parity bit generated during the ECC encoding process for correcting the error bit of the read data. When the number of the error bits is greater than or equal to a threshold number of correctable error bits, the error correction circuitry 138 may not correct error bits but instead may output an error correction fail signal indicating failure in correcting the error bits.

According to an embodiment, the error correction circuitry 138 may perform an error correction operation based on a coded modulation. Examples include low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), and a Block coded modulation (BCM). The error correction circuitry 138 may include circuits, modules, systems, and/or devices for performing the error correction operation based on at least one of the above-described codes.

For example, the ECC decoder may perform hard decision decoding or soft decision decoding for data transmitted from the memory device 150. As one of two methods broadly classified for error correction, the hard decision decoding may include an operation of correcting an error by reading digital data of '0' or '1' from a non-volatile memory cell in the memory device 150. Because the hard decision decoding handles a binary logic signal, a design or a configuration of circuit or algorithm may be simple and a processing speed may be faster than the soft decision decoding.

Soft decision decoding may quantize a threshold voltage of a non-volatile memory cell in the memory device 150 based on two or more quantized values (e.g., multiple bit data, approximate values, an analog value, and the like) in order to correct an error based on the two or more quantized values. The controller 130 can receive two or more alphabets or quantized values from a plurality of non-volatile memory cells in the memory device 150, and then perform decoding based on information generated by characterizing the quantized values as a combination of information such as conditional probability or likelihood.

According to an embodiment, the ECC decoder may use low-density parity-check and generator matrix (LDPC-GM) code among methods designed for the soft decision decoding. Here, the low-density parity-check (LDPC) code uses an algorithm that can read values of data from the memory device 150 in several bits according to reliability, not simply data of 1 or 0 like the hard decision decoding, and iteratively repeats it through a message exchange in order to improve reliability of the values. Then, the values may be finally determined as data of 1 or 0. For example, a decoding algorithm using LDPC codes can be understood as probabilistic decoding. The hard decision decoding may output a value from a non-volatile memory cell that is coded as 0 or 1. Compared to hard decision decoding, the soft decision decoding can determine the value stored in the non-volatile memory cell based on the stochastic information. Regarding bit-flipping which may considered an error that can occur in the memory device 150, the soft decision decoding may provide improved probability of correcting an error and recovering data, as well as provide a reliability and stability of corrected data. The LDPC-GM code may have a scheme in which internal LDGM codes can be concatenated in series with high-speed LDPC codes.

According to an embodiment, the ECC decoder may use a low-density parity-check conventional convolutional codes (LDPC-CCs) code among methods designed for the soft decision decoding. Herein, the LDPC-CCs code may have a scheme using a linear time encoding and a pipeline decoding based on a variable block length and a shift register.

According to an embodiment, the ECC decoder may use a Log Likelihood Ratio Turbo Code (LLR-TC) among methods designed for the soft decision decoding. The Log Likelihood Ratio (LLR) may be calculated as a non-linear function for a distance between a sampled value and an ideal value. In addition, Turbo Code (TC) may include a simple code (for example, a Hamming code) in two or three dimensions, and repeat decoding in a row direction and a column direction to improve reliability of values.

The power management unit (PMU) 140 may control electrical power provided in the controller 130. The PMU 140 may monitor the electrical power supplied to the memory system 110 (e.g., a voltage supplied to the controller 130) and provide the electrical power to components included in the controller 130. The PMU 140 may not only detect power-on or power-off, but may also generate a trigger signal to enable the memory system 110 to back up a current state urgently when the electrical power supplied to the memory system 110 is unstable. According to an embodiment, the PMU 140 may include a device or a component capable of accumulating electrical power that may be used in an emergency.

The memory interface 142 may serve as an interface for handling commands and data transferred between the controller 130 and the memory device 150, in order to allow the controller 130 to control the memory device 150 in response to a command or a request input from the host 102. The memory interface 142 may generate a control signal for the memory device 150 and may process data input to, or output from, the memory device 150 under the control of the processor 134 when, for example, the memory device 150 is a flash memory. In one embodiment, when the memory device 150 includes a NAND flash memory, the memory interface 142 includes a NAND flash controller (NFC). The memory interface 142 can provide an interface for handling commands and data between the controller 130 and the memory device 150. In accordance with an embodiment, the memory interface 142 can be implemented through, or driven by, firmware called a Flash Interface Layer (FIL) as a component for exchanging data with the memory device 150.

According to an embodiment, the memory interface 142 may support an open NAND flash interface (ONFi), a toggle mode or the like for data input/output with the memory device 150. For example, the ONFi may use a data path (e.g., a channel, a way, etc.) that includes at least one signal line capable of supporting bi-directional transmission and reception in a unit of 8-bit or 16-bit data. Data communication between the controller 130 and the memory device 150 can be achieved through at least one interface that performs, for example, asynchronous single data rate (SDR), synchronous double data rate (DDR), and toggle double data rate (DDR) communications protocol.

The memory 144 may serve as a working memory in the memory system 110 or the controller 130, while storing temporary or transactional data occurring or delivered for operations in the memory system 110 and the controller 130. For example, the memory 144 may temporarily store read data output from the memory device 150 in response to a request from the host 102, before the piece of read data is output to the host 102. In addition, the controller 130 may temporarily store a piece of write data input from the host 102 in the memory 144, before programming the piece of write data in the memory device 150. When the controller 130 controls operations (e.g., data read, data write, data program, data erase, etc.) of the memory device 150, data transmitted or generated between the controller 130 and the memory device 150 of the memory system 110 may be stored in the memory 144. In addition to the read data or write data, the memory 144 may store information (e.g., map data, read requests, program requests, etc.) used for inputting or outputting data between the host 102 and the memory device 150. According to an embodiment, the memory 144 may include a command queue, a program memory, a data memory, a write buffer/cache, a read buffer/cache, a data buffer/cache, a map buffer/cache, and/or the like. The controller 130 may allocate some storage space in the memory 144 for a component which is established to carry out a data input/output operation. For example, the write buffer established in the memory 144 may be used to temporarily store target data subject to a program operation.

In an embodiment, the memory 144 may be implemented with a volatile memory. For example, the memory 144 may be implemented with a static random access memory (SRAM), a dynamic random access memory (DRAM), or both. Although FIG. 1 illustrates the example of the memory 144 disposed within the controller 130, the embodiments are not limited thereto. The memory 144 may be located within or external to the controller 130. For instance, the memory 144 may be embodied by an external volatile memory having a memory interface transferring data and/or signals between the memory 144 and the controller 130.

The processor 134 may control overall operations of the memory system 110. For example, the processor 134 can control a program operation or a read operation of the memory device 150, in response to a write request or a read request entered from the host 102. According to an embodiment, the processor 134 may execute firmware (or other instructions/program codes) to control the program operation or the read operation in the memory system 110. For example, the firmware (or instructions/program codes) executed through the processor 134 may constitute a flash translation layer (FTL). An example of the FTL is later described in detail with reference to FIG. 3. According to an embodiment, the processor 134 may be implemented with a microprocessor or a central processing unit (CPU).

According to an embodiment, the memory system 110 may be implemented with at least one multi-core processor. The multi-core processor is a kind of circuit or chip in which two or more cores, which serve as distinct processing regions, are integrated. For example, when a plurality of cores in the multi-core processor drive or execute a plurality of flash translation layers (FTLs) independently, data input/output speed (or performance) of the memory system 110 may be improved. According to an embodiment, the data input/output (I/O) operations in the memory system 110 may be independently performed through different cores in the multi-core processor.

The processor 134 in the controller 130 may perform an operation corresponding to a request or a command input from the host 102. Further, the memory system 110 may be independent of a command or a request input from an external device such as the host 102. In some cases, an operation performed by the controller 130 in response to the request or the command input from the host 102 may be considered a foreground operation. In other cases, an operation performed by the controller 130 independently (e.g., regardless the request or the command inputted from the host 102) may be considered a background operation. The controller 130 can perform the foreground or background operation for read, write or program, erase and the like, regarding data in the memory device 150.

In addition, a parameter set operation corresponding to a set parameter command or a set feature command as a set command transmitted from the host 102 may be considered a foreground operation. Meanwhile, as a background operation without a command transmitted from the host 102, the controller 130 can perform garbage collection (GC), wear leveling (WL), bad block management for identifying and processing bad blocks, or the like, may be performed in relation to a plurality of memory blocks 152, 154, 156 included in the memory device 150.

According an embodiment, substantially similar operations may be performed as both foreground and background operations in the memory system 110. For example, if the memory system 110 performs garbage collection in response to a request or a command input from the host 102 (e.g., Manual GC), garbage collection can be considered a foreground operation. However, when the memory system 110 performs garbage collection independently of the host 102 (e.g., Auto GC), garbage collection can be considered a background operation.

When the memory device 150 includes a plurality of dies (or a plurality of chips) including non-volatile memory cells, the controller 130 may be configured to perform a parallel processing regarding plural requests or commands input from the host 102, in order to improve performance of the memory system 110. For example, the transmitted requests or commands may be divided and processed simultaneously into a plurality of dies or a plurality of chips in the memory device 150. The memory interface 142 in the controller 130 may be connected to a plurality of dies or chips in the memory device 150 through at least one channel and at least one way.

When the controller 130 distributes and stores data in the plurality of dies through each channel or each way in response to requests or commands associated with a plurality of pages including non-volatile memory cells, plural operations corresponding to the requests or the commands can be performed simultaneously or in parallel. Such a processing method or scheme can be considered as an interleaving method. Because data input/output speed of the memory system 110 operating with the interleaving method may be faster than that without the interleaving method, data I/O performance of the memory system 110 can be improved.

By the way of example but not limitation, the controller 130 can recognize statuses regarding a plurality of channels (or ways) associated with a plurality of memory dies included in the memory device 150. The controller 130 may determine the status of each channel or each way as one of a busy status, a ready status, an active status, an idle status, a normal status, and/or an abnormal status. The determination by the controller of which channel or way an instruction (and/or a data) is delivered through can be associated with a physical block address, e.g., which die(s) the instruction (and/or the data) is delivered into. The controller 130 can refer to descriptors delivered from the memory device 150. The descriptors can include a block or page of parameters that describe something about the memory device 150, which is data with a predetermined format or structure. Herein, the predetermined format or structure may be determined based on a protocol or settled specification between components. For instance, the descriptors may include device descriptors, configuration descriptors, unit descriptors, and the like. The controller 130 can refer to, or use, the descriptors to determine which channel(s) or way(s) an instruction or a piece of data is exchanged through.

Referring to FIG. 1, the memory device 150 in the memory system 110 may include the plurality of memory blocks 152, 154, 156. Each of the plurality of memory blocks 152, 154, 156 may include a plurality of non-volatile memory cells. According to an embodiment, the memory block 152, 154, 156 can be a group of non-volatile memory cells erased together. The memory block 152, 154, 156 may include a plurality of pages which is a group of non-volatile memory cells read or programmed together. Each memory block 152, 154, 156 may have a three-dimensional stack structure for a high integration. Further, the memory device 150 may include a plurality of dies, each die including a plurality of planes, and each plane including the plurality of memory blocks 152, 154, 156. In another embodiment, the memory device 150 may have a different configuration, for example, in order to achieve predetermined performance goals or to achieve one or more intended applications of the memory system 110.

In the memory device 150 shown in FIG. 1, the plurality of memory blocks 152, 154, 156 are included. The plurality of memory blocks 152, 154, 156 can be various types of memory blocks (e.g., single-level cell (SLC) memory blocks, multi-level cell (MLC) Cell memory blocks, etc.) according to the number of bits that can be stored or represented in one memory cell. The SLC memory block may include a plurality of pages implemented by memory cells, each storing one bit of data. The SLC memory block can have high data I/O operation performance and high durability. The MLC memory block may include a plurality of pages implemented by memory cells, each storing multi-bit data (e.g., two bits or more).

In one embodiment, the MLC memory block can have larger storage capacity for the same space compared to the storage capacity of the SLC memory block. The MLC memory block can be highly integrated in a view of storage capacity. In an embodiment, the memory device 150 may be implemented with MLC memory blocks, including, for example, double level cell (DLC) memory blocks, triple-level cell (TLC) memory blocks, quadruple-level cell (QLC) memory blocks, and a combination thereof. The double-level cell (DLC) memory blocks may include a plurality of pages implemented by memory cells, each capable of storing 2-bit data. The triple-level cell (TLC) memory blocks may include a plurality of pages implemented by memory cells, each capable of storing 3-bit data. The quadruple-level cell (QLC) memory blocks may include a plurality of pages implemented by memory cells, each capable of storing 4-bit data. In other embodiments, memory device 150 can be implemented with a block including a plurality of pages implemented by memory cells, each capable of storing five or more bits of data.

According to an embodiment, the controller 130 may use a multi-level cell (MLC) memory block included in the memory system 150 as an SLC memory block that stores one-bit data in one memory cell. A data input/output speed of the multi-level cell (MLC) memory block can be different from (e.g., slower than) that of the SLC memory block. For example, when the MLC memory block is used as the SLC memory block, a margin for a read or program operation can be reduced. The controller 130 can utilize a different (e.g., faster) data input/output speed of the multi-level cell (MLC) memory block when using the multi-level cell (MLC) memory block as the SLC memory block. For example, the controller 130 can use the MLC memory block as a buffer to temporarily store data because the buffer may require a high data input/output speed for improving performance of the memory system 110.

Further, according to an embodiment, the controller 130 may program data in a multi-level cell (MLC) a plurality of times without performing an erase operation on a specific MLC memory block included in the memory system 150. In some cases, non-volatile memory cells may have a feature that does not support data overwrite. However, the controller 130 may use a feature in which a multi-level cell (MLC) may store multi-bit data, in order to program plural 1-bit data in the MLC a plurality of times. For MLC overwrite operation, the controller 130 may store the number of program times as separate operation information when 1-bit data is programmed in a non-volatile memory cell. According to an embodiment, an operation for uniformly levelling threshold voltages of non-volatile memory cells can be carried out before additional data is overwritten in the same non-volatile memory cells.

In an embodiment, the memory device 150 may be embodied as a non-volatile memory such as a flash memory, and, for example, such as a NAND flash memory, a NOR flash memory, and the like. In one embodiment, the memory device 150 may be implemented, for example, by at least one of a phase change random access memory (PCRAM), a ferroelectrics random access memory (FRAM), a spin injection magnetic memory (SU-RAM), and a spin transfer torque magnetic random access memory (STT-MRAM), or the like.

Figure 2:
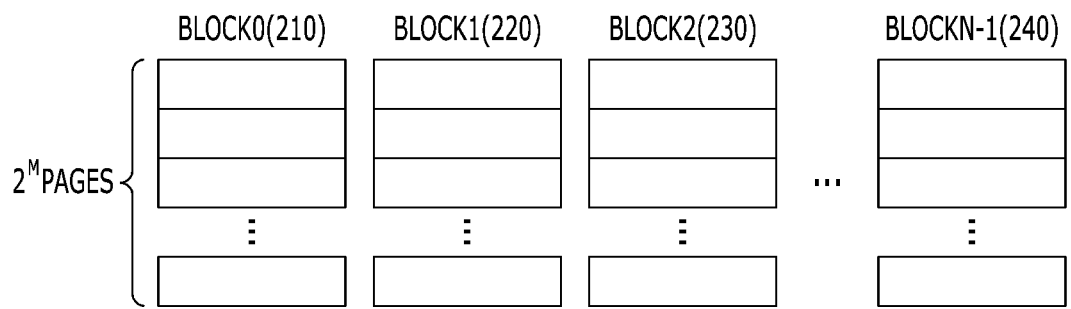
FIG. 2 illustrates a memory device in a memory system according to an embodiment.

FIG. 2 illustrates a configuration of the memory device 150 according to an embodiment. Referring to FIG. 2, the memory device 150 may include a plurality of memory blocks 0 to N−1, with each of the blocks 0 to N−1 including a plurality of pages (e.g., 2 M pages) and the number of which may vary according to circuit design. Memory cells included in the respective memory blocks 0 to N−1 may be one or more of a single level cell (SLC) storing 1-bit data or a multi-level cell (MLC) storing 2- or more bit data. In an embodiment, the memory device 150 may include a plurality of triple level cells (TLC) each storing 3-bit data. In another embodiment, the memory device may include a plurality of quadruple level cells (QLC) each storing 4-bit level cell.

Figure 3:
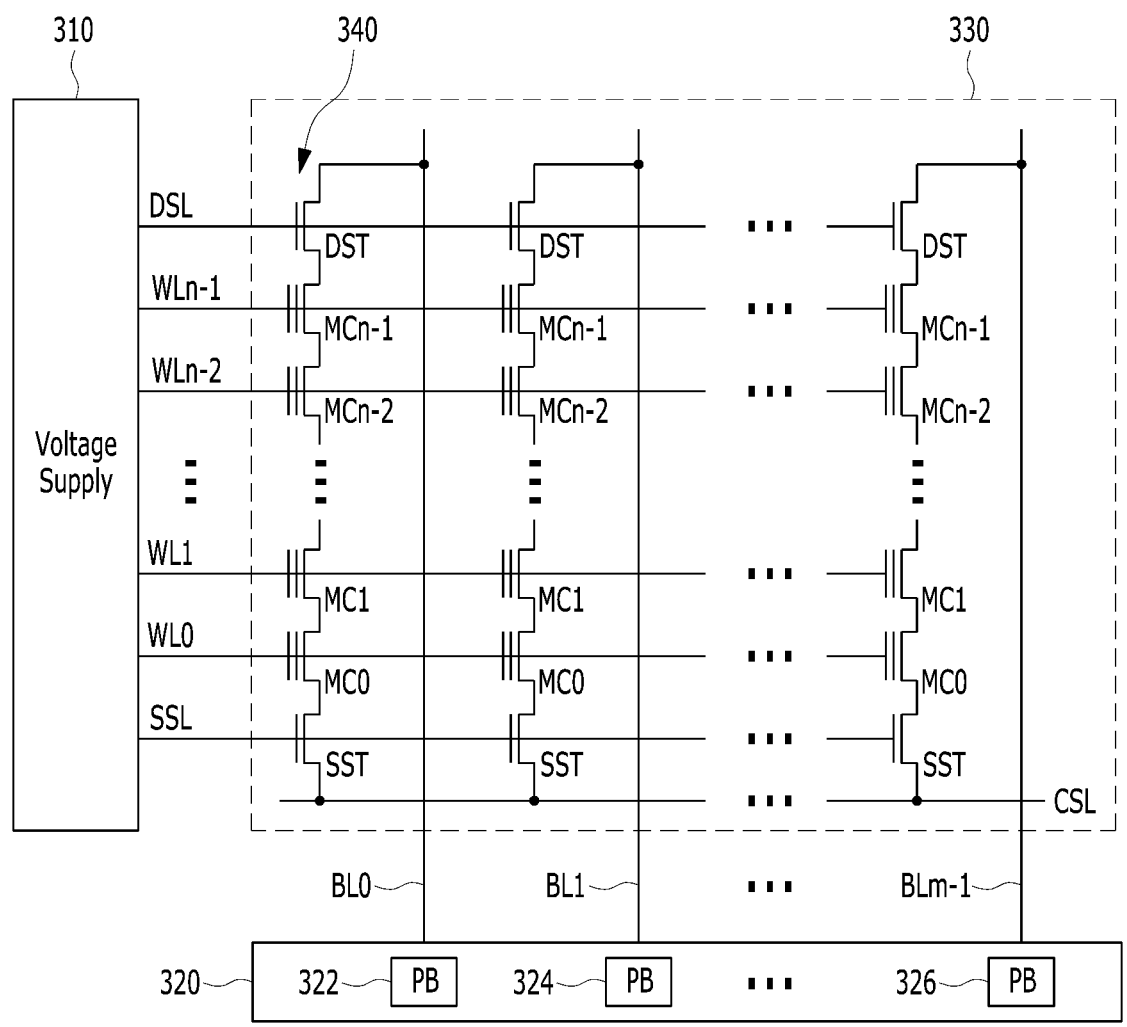
FIG. 3 illustrates a memory cell array in a memory block according to an embodiment.

FIG. 3 illustrates a circuit configuration of a memory cell array of a memory block 330 in the memory device 150 according to an embodiment. Referring to FIG. 3, the memory block 330 may be representative of one or more of the plurality of memory blocks 152 to 156 included in the memory device 150 of the memory system 110, and may include a plurality of cell strings 340 coupled to a plurality of corresponding bit lines BL0 to BLm−1. The cell string 340 of each column may include one or more drain select transistors DST and one or more source select transistors SST. Between the drain and source select transistors DST, SST, a plurality of memory cells MC0 to MCn−1 may be coupled in series. In an embodiment, each of the memory cell transistors MC0 to MCn−1 may be embodied by an MLC capable of storing data information of a plurality of bits. Each of the cell strings 340 may be electrically coupled to a corresponding bit line among the plurality of bit lines BL0 to BLm−1. For example, as illustrated in FIG. 3, the first cell string is coupled to the first bit line BL0, and the last cell string is coupled to the last bit line BLm−1.

Although FIG. 3 illustrates NAND flash memory cells, the memory cells may be a different type in another embodiment. For example, the memory cells may be NOR flash memory cells or hybrid flash memory cells, the latter of which may include two or more types of memory cells combined therein. Also, the memory device 150 may be a flash memory device including a conductive floating gate as a charge storage layer or a charge trap flash (CTF) memory device including an insulation layer as a charge storage layer.

The memory device 150 may further include a voltage supply unit 310 which provides word line voltages (e.g., a program voltage, a read voltage, and a pass voltage) to supply to the word lines according to operation mode. The voltage generation operation of the voltage supply unit 310 may be controlled by a control circuit. Under the control of the control circuit, the voltage supply unit 310 may select one of the memory blocks (or sectors) of the memory cell array, may select one of the word lines of the selected memory block, and may provide the word line voltages to the selected word line and unselected word lines.

The memory device 150 may include a read/write circuit 320 which is controlled by the control circuit. During a verification/normal read operation, the read/write circuit 320 may operate as a sense amplifier for reading data from the memory cell array. During a program operation, the read/write circuit 320 may operate as a write driver for driving bit lines according to data to be stored in the memory cell array. During a program operation, the read/write circuit 320 may receive, from a page buffer, data to be stored into the memory cell array and may supply a current or a voltage onto bit lines according to the received data. The read/write circuit 320 may include a plurality of page buffers 322 to 326 respectively corresponding to columns (or bit lines) or column pairs (or bit line pairs). Each of the page buffers 322 to 326 may include a plurality of latches.

Figure 4:
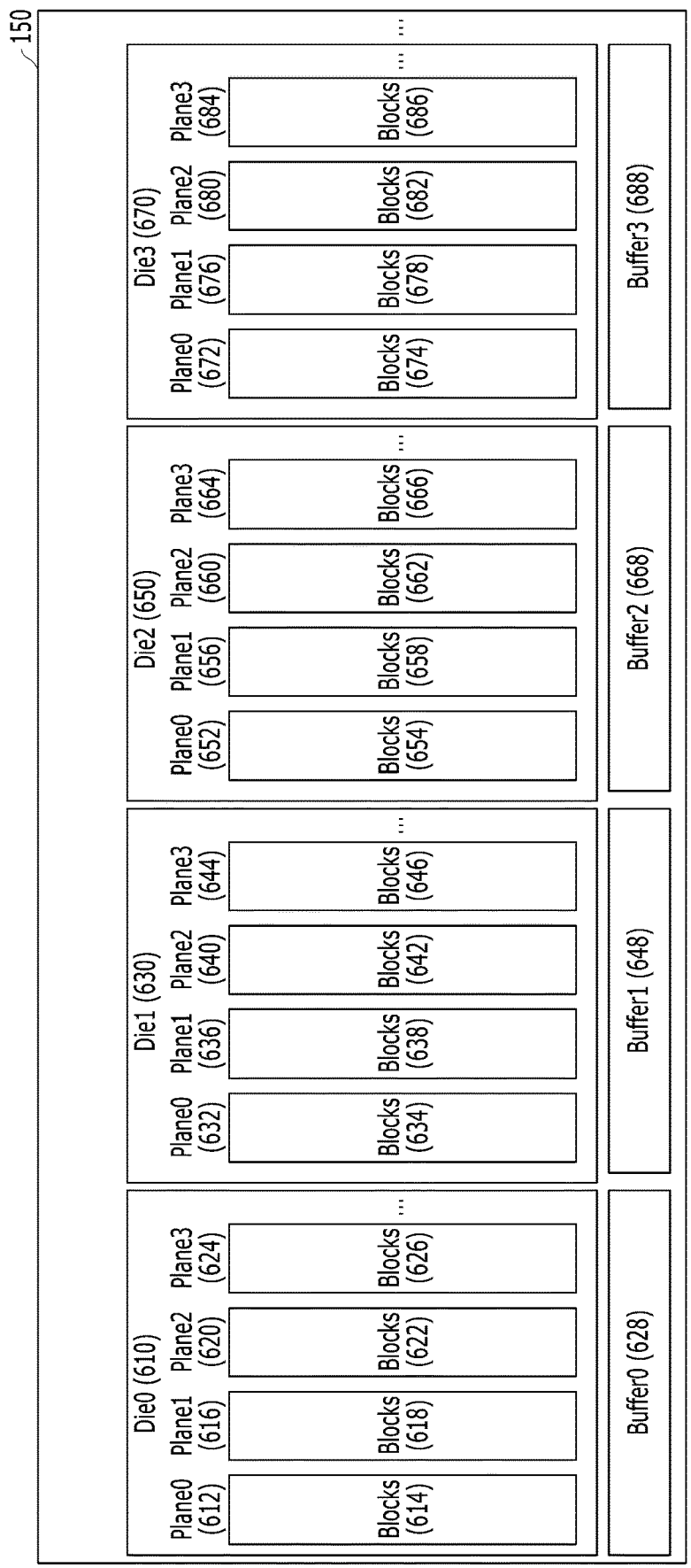
FIG. 4 illustrates a memory device according to an embodiment.

FIG. 4 illustrates an embodiment of a memory device 150 which includes a plurality of memory dies, for example, a memory die0 610, a memory die1 630, a memory die2 650, and a memory die3 670. Each of the memory dies may include a plurality of planes, for example, a plane 0, a plane 1, a plane 2 and a plane 3. For example, the memory die0 610 may include a plane0 612, a plane1 616, a planet 620, and a plane3 624. The memory die1 630 may include a plane0 632, a plane1 636, a planet 640, and a plane3 644. The memory die2 650 may include a plane0 652, a plane1 656, a planet 660, and a plane3 664. The memory die3 670 may include a plane0 672, a plane1 676, a planet 680, and a plane3 684.

Each of the planes in the memory dies of the memory device 150 may include one or more of memory blocks (e.g., N number of blocks Block0, Block1, . . . , BlockN−1), each including a plurality of pages (e.g., 2 M number of pages), as described above with reference to FIG. 2. For example, in the memory die0, the plane0 612 may include one or more blocks 614, the plane1 616 may include one or more blocks 618, the planet 620 may include one or more blocks 622, and the plane3 624 may include one or more blocks 626. In the memory die1, the plane0 632 may include one or more blocks 634, the plane1 636 may include one or more blocks 638, the planet 640 may include one or more blocks 642, and the plane3 may 644 include one or more blocks 646. In the memory die2, the plane0 652 may include one or more blocks 654, the plane1 656 may include one or more blocks 658, the planet 660 may include one or more blocks 662, and the plane3 664 may include one or more blocks 666. In the memory die3, the plane0 672 may include one or more blocks 674, the plane1 676 may include one or more blocks 678, the planet 680 may include one or more blocks 682, and the plane3 684 may include one or more blocks 686.

Moreover, the memory device 150 includes a plurality of buffers corresponding to the respective memory dies. For example, a buffer0 628 corresponds to the memory die0 610, a buffer1 648 corresponds to the memory die1 630, a buffer2 668 corresponds to the memory die2 650, and a buffer3 688 corresponds to the memory die3 670. In another embodiment, the memory device 150 may include a plurality of buffers corresponding to each of the memory planes. Each plane may include one or more blocks and a buffer.

When performing command operations corresponding to a plurality of commands received from the host 102, data corresponding to the command operations are stored in the buffers included in the memory device 150. For example, when performing program operations, data corresponding to the program operations are stored in the buffers, and are then stored in the pages included in the memory blocks of the memory dies. When performing read operations, data corresponding to the read operations are read from the pages included in the memory blocks of the memory dies and then are stored in the buffers and provided to the host 102 through the controller 130.

In FIG. 4, the buffers included in the memory device 150 exist outside the respective corresponding memory dies. But, in another embodiment, the buffers may exist inside the respective corresponding memory dies. Also, the buffers may correspond to the respective planes or the respective memory blocks in the respective memory dies. Further, referring to FIGS. 3 and 4, the buffers included in the memory device 150 are considered the plurality of page buffers 322, 324 and 326 included in the memory device 150. But, in another embodiment, the buffers may be a plurality of caches or a plurality of registers included in the memory device 150.

The plurality of memory blocks included in the memory device 150 may be grouped into a plurality of super memory blocks and command operations may be performed in the plurality of super memory blocks. Each of the super memory blocks may include a plurality of memory blocks, for example, memory blocks included in a first memory block group and a second memory block group. In this regard, when the first memory block group is included in the first plane of a certain first memory die, the second memory block group may be included in the first plane of the first memory die, be included in the second plane of the first memory die, or be included in the planes of a second memory die.

In an embodiment, a data processing system may include plural memory systems. Each of the plural memory systems 110 can include the controller 130 and the memory device 150. In the data processing system, one of the plural memory systems 110 can be a master and the others can be a slave. The master may be determined based on contention between the plural memory systems 110. When a plurality of commands is delivered from the host 102 in the data processing system, the master can determine a destination of each command based at least on statuses of channels or buses. For example, a first memory system can be determined as a master memory system, among a plurality of memory systems, corresponding to information delivered from the plurality of memory systems. When the first memory system is determined as the master memory system, the remaining memory systems may be considered slave memory systems.

A controller of the master memory system can check statuses of a plurality of channels (or ways, buses) coupled to a plurality of memory systems, in order to select which memory system handles commands or data delivered from the host 102. In an embodiment, a master can be dynamically determined among the plural memory systems. In another embodiment, a master memory system may be changed with one of the other slave memory systems periodically or according to an event.

Hereinafter, a method and apparatus for transferring data in the memory system 110 including the memory system 150 and the controller 130 described above will be described in more detail. When the amount of data stored in the memory system 110 becomes larger, the memory system 110 may be required to read or store large amounts of data at a time. However, a read time for reading data stored in the memory device 150, or a program/write time for writing data in the memory device 150, may be longer than a handling time for the controller 130 to process a data or a data transmission time between the controller 130 and the memory system 150. For example, the read time might be two times longer than the handling time. Since the read time or the program time may be longer (and even much longer) than the handling time or the data transmission time, a procedure or process for delivering data in the memory system 110 may affect performance of the memory system 110, e.g., an operation speed, and/or structure of the memory system 110 such as a buffer size.

Figure 5:
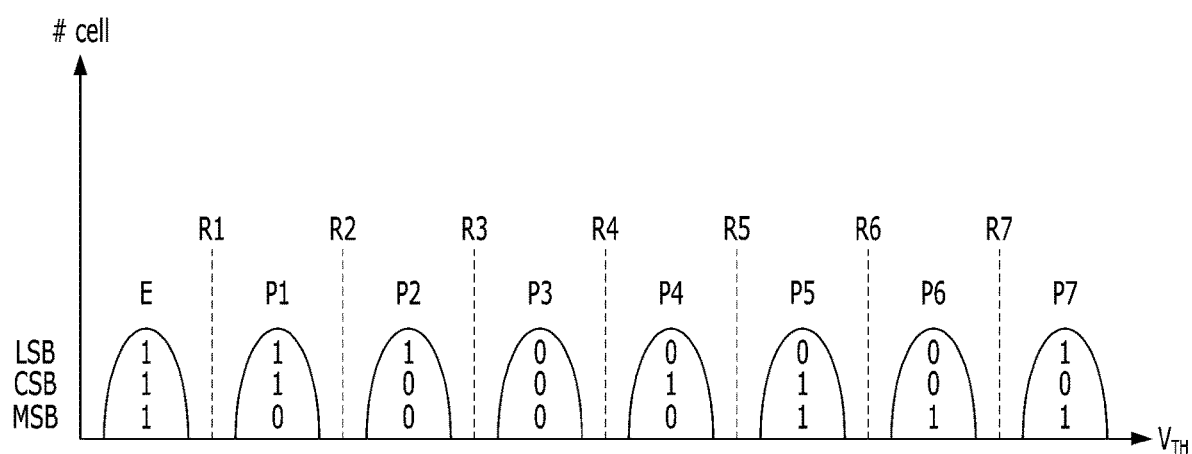
FIG. 5 illustrates a graph of a threshold voltage distribution corresponding to program states and erase states of memory cells according to an embodiment.

FIG. 5 is a graph showing an example of a threshold voltage distribution regarding program states and erase states of TLC memory cells. In a TLC memory block in the memory device, a single memory cell can store 3-bit data including the Most Significant Bit (MSB), the Central Significant Bit (CSB), and the Least Significant Bit (LSB). For example, in the TLC memory block, the state regarding a threshold voltage in each of plural memory cells may be one of eight states, including an erasing state E and first to seventh program states P1 to P7 (as illustratively shown in FIG. 5) which may be determined based on data programmed in each memory cell. For example, when a memory cell is programmed with data having a 3-bit value of '111' (where all MSB, CSB, and LSB bits of the memory cell are programmed with a value of '1'), the memory cell may have a threshold voltage corresponding to the erase state (E). In other cases, each memory cell may be programmed with 3-bit data having any one of the possible values: '011,' '001,' '000,' '010,' '110,' '100,' and '101.' These values '011,' '001,' '000,' '010,' '110,' '100,' and '101' can correspond, for example, to the first to the seventh program states P1 to P7, respectively.

In the TLC memory block, first to third pages (each page corresponding to the LSB, the CSB, and the MSB of each memory cells individually) may be programmed or read together. The first to third pages may store LSB data, CSB data and MSB data, individually. For example, the controller can supply LSB read voltages into plural memory cells to recognize some memory cells as having a value of '1' and the other memory cells as having a value of '0,' as the LSB of each of the plural memory cell corresponding to the first page.

Supplying CSB read voltages into the plural memory cells, the controller can recognize some memory cells as having a value of '1' and other memory cells as having a value of '0,' as the CSB of each memory cell corresponding to the second page.

Further, the controller can supply MSB read voltages into plural memory cells to recognize some memory cells as having a value of '1' and the other memory cells as having a value of '0,' as the MSB of each of the plural memory cell corresponding to the third page. Referring to the example of FIG. 5, read voltages can include two LSB read voltages R3, R7, three CSB read voltages R2, R4, R6, and two MSB read voltages R1, R5.

The read voltages may be used to distinguish a memory cell having a value of '1' from another memory cell having a value of '0.' In order to recognize the LSB data stored in the first page corresponding to the LSB of each memory cell, a third read voltage R3 can be used to distinguish some states (e.g., E, P1, P2) from the other states (e.g., P3 to P7) in the threshold voltage distribution. A seventh read voltage R7 can be used to distinguish a seventh program state P7 from the other states (e.g., E, P1 to P6). Thus, using the third and the seventh read voltages R3, R7, the controller can recognize which value of '1' or '0' a threshold voltage of each memory cell is recognized as the LSB so that the first page can be read.

When supplying the third read voltage R3 into the plural memory cells, the controller 130 may identify some memory cells that are turned on, e.g., memory cells in which their LSB has the value of '1'. Based on the seventh read voltage R7, the controller 130 may identify some memory cells that are turned off, e.g., memory cells in which the LSB has the value of '1'. Then, the controller 130 may recognize some memory cells that are turned off when the third read voltage R3 is supplied and turned on when the seventh read voltage R7 is supplied. As a result, the LSB of the some memory cells can be identified as the value of '0' based on the third and the seventh read voltages R3, R7.

Regarding CSBs of the plural memory cells, the controller may use three read voltages (e.g., R2, R4, R6) to determine the values ('1' or '0') of the CBS of the plural memory cells. The controller 130 may supply a second read voltage R2 into the plural memory cells so that some memory cells that are turned on, e.g., memory cells in which their LSB has the value of '1,' can be recognized. The erase state E and a first program state P1 of the plural memory cells can be distinguished from the other states P2 to P7.

Further, the controller 130 may supply a fourth read voltage R4 into the plural memory cells so as to distinguish some memory cells having some states (e.g., E, P1 to P3) from the other memory cells having the other states (e.g., P4 to P7). Then, the controller 130 may recognize some memory cells that are turned off when the second read voltage R2 is supplied and turned on when the fourth read voltage R4 is supplied. As a result, CSBs of the some memory cell can be identified as the value of '0' based on the second read voltage R2 and the fourth read voltage R4.

The controller 130 may be further configured to supply a sixth read voltage R6 into the plurality memory cells. As a result of supplying the sixth read voltage R6 as the CSB voltage to read the second page, the controller 130 may distinguish some memory cells that are turned off such as sixth and seventh program states P6, P7 from the other memory cells having the other states (e.g., E, P1 to P5), so that the CSBs of the some memory cells can be determined as the value of '0.' Then, the controller 130 may recognize some memory cells that are turned on when the sixth read voltage R6 is supplied and turned off when the fourth read voltage R4 is supplied. As a result, the CSBs of the some memory cell can be identified as the value of '0' based on the sixth read voltage R6 and the fourth read voltage R4.

In addition, MSBs of the plural memory cells may be identified based on first and fifth read voltages R1, R5. As a result of supplying the first voltage R1 to read the third page corresponding the MSBs, the controller 130 may distinguish some memory cells having the erase state E from the other memory cells having the other states P1 to P7, in order to recognize that the some memory cells have a threshold voltage corresponding to the MSB of '1'.

Further, the controller 130 may use the fifth read voltage R5 to distinguish some memory cells having the erase state E and the first to fourth program states P1 to P4 from the other memory cells having the other states P5 to P7, so that MSBs of the other memory cells turned off by the fifth read voltage R5 can be recognized as the value of '1.' Based on the first read voltage R1 and the fifth read voltage R5, the controller 130 can determine which memory cells stores the value of '0.' The controller 130 can recognize some memory cells that is turned off when the first read voltage R1 is supplied and turned on when the fifth read voltage R5 is supplied, so that the MSBs of some memory cells are read as the value of '0.'

As a result of reading the LSB, CSB and MSB of each memory cell, the controller 130 may determine that a memory cell has the erase state E when the MSB, CSB, and LSB data (e.g., 3-bit data) are all the value of '1', e.g., the memory cell in which 3-bit data having a value of 111 is programmed. The controller 130 may determine that the memory cell has a threshold voltage corresponding to 3-bit data of 111. Likewise, the controller 130 may be configured to determine which one of values of '011,' '001,' '000,' '010,' '110,' '100,' and '101' is programmed in each memory cell. When recognizing a threshold voltage of each memory cell based on the 3-bit data (e.g., erase state E and first to seventh program states P1 to P7), the controller 130 may estimate the threshold voltage distribution regarding the plural memory cells.

In a non-volatile memory device, a threshold voltage of at least some memory cells may be changed according to a read disturb, retention characteristics, or the like. The threshold voltage of at least some memory cells may cause a change (or shift) of the threshold voltage distribution. When a read operation is performed using read voltages having levels optimized for a previous threshold voltage distribution, an error may occur in read data after the threshold voltage distribution is shifted. Referring to FIG. 1, the ECC circuitry 138 may detect and correct the error in the read data. However, when the number of error bits is greater than a threshold, the ECC circuitry might not cure the error in the read data. In this case, the controller 130 may control the memory device 150 to perform a read retry operation.

The read retry operation may include a read operation using adjusted levels of read voltages. The levels of read voltages may be adjusted based on a read retry table including read bias sets. Even though the error in the read data is not corrected even after the read retry operation is performed, the controller 130 may try to change levels of read voltages to perform a further read operation or the like. The controller 130 may change levels of the read voltages which may be optimized for the shifted threshold voltage distribution, until the error in the read data is corrected.

Figure 6:
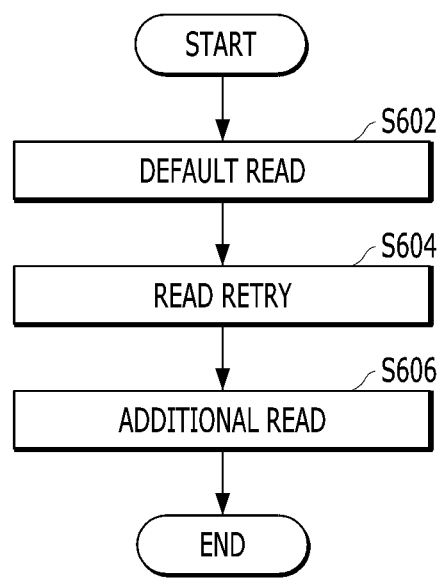
FIG. 6 illustrates an embodiment of a read operation performed when an uncorrectable error occurs.

FIG. 6 is a flowchart showing a read operation performed when an uncorrectable error occurs. In operation S602, the controller 130 may control the memory device to perform a default read operation in response to a read command provided from the host. The default read operation refers to a read operation performed first on a memory block corresponding to a physical address associated with a logical address inputted along with the read command. In the default read operation, default levels of read voltages may be supplied into plural memory cells. In one embodiment, the default levels of the read voltages may correspond to set initial levels. In one embodiment, the read voltages may have default levels as previously supplied to the plural memory cells for a previous read operation which has completed successfully. When a plurality of read voltages are required to identify multi-bit data stored in each memory cell (such as a TLC memory block), the read voltages may be supplied in a set order.

Referring again to FIG. 5, for example, the controller 130 can supply the third and the seventh read voltages R3, R7 into the plural memory cells in order to read LSB data stored in the plural memory cells of the TLC memory block. The third and the seventh read voltages R3, R7 may be supplied in a set order. The seventh read voltage R7 may be supplied into the plural memory cells after the third read voltage R3 is supplied. After reading the LSB data, the controller 130 can supply the second, the fourth, and the sixth read voltages R2, R4, R6 into the same memory cells to read CSB data stored therein. The second, fourth, and sixth read voltages R2, R4, R6 may be supplied in a set order such as an order of the second read voltage R2, the fourth read voltage R4 and the sixth read voltage R6. After reading the CSB data, the controller 130 can supply the first and the fifth read voltages R1 and R5 into the same memory cells in order to read MSB data. The first and the fifth read voltages R1, R5 are supplied in a set order such as an order of the first read voltage R1 and the fifth read voltage R5.

In operation S604, the controller may control the memory device to perform a read retry operation when the default read operation performed in operation S602 has failed. In one embodiment, the controller may control the memory device to perform read operations sequentially and repeatedly until the read retry operation is successfully completed. Each read operation in the read retry operation may use different levels of read voltages. The levels of read voltages may be determined, for example, based on the read retry table including a plurality of read bias sets. The read retry operation may include read operations performed according to the number of the plurality of read bias sets, to read the LSB data, the CSB data and the MSB data stored in the plural memory cells. Thus, when the read retry operation is performed after a failure of the default read operation, it may take a relatively long period of time for the memory system 110 to output read data corresponding to a request input from the host 102. Accordingly, whether the default read operation is successfully completed in operation S602 may greatly affect performance regarding the read operation in the memory system.

In operation S606, when the read retry operation performed in operation S604 has failed, the controller 130 may control the memory device to perform an additional read operation. Because the default read operation and the read retry operation has failed, the memory system can search for an optimal read voltage based on various algorithms (through the additional read operation) to output the LSB data, the CSB data and the MSB data stored in the plural memory cells. For example, the controller may determine levels of the read voltages as an intermediate value of each of the adjacent peak values in the threshold voltage distribution (e.g., according to a Gaussian modeling algorithm) in order to search for the optimal read voltage. In addition, the controller 130 may read specific data at least twice or more to determine the optimal read voltage based on read results.

As described above, the controller 130 may output read data to the host by performing the default read operation, the read retry operation, and the additional read operation in stages (i.e., not all at once) until an error in the read data is cured or corrected. The time spent for the read operation may be determined, for example, as the time taken from a first timing when the controller receives a read command to a second timing when the controller outputs read data to the host. When the default read operation performed first is successful, neither the read retry operation nor the additional read operation is performed, so that the time spent for the read operation can be shortened. Thus, in at least one embodiment, success or failure of the default read operation may be closely related to the performance of the read operation.

Figure 7:
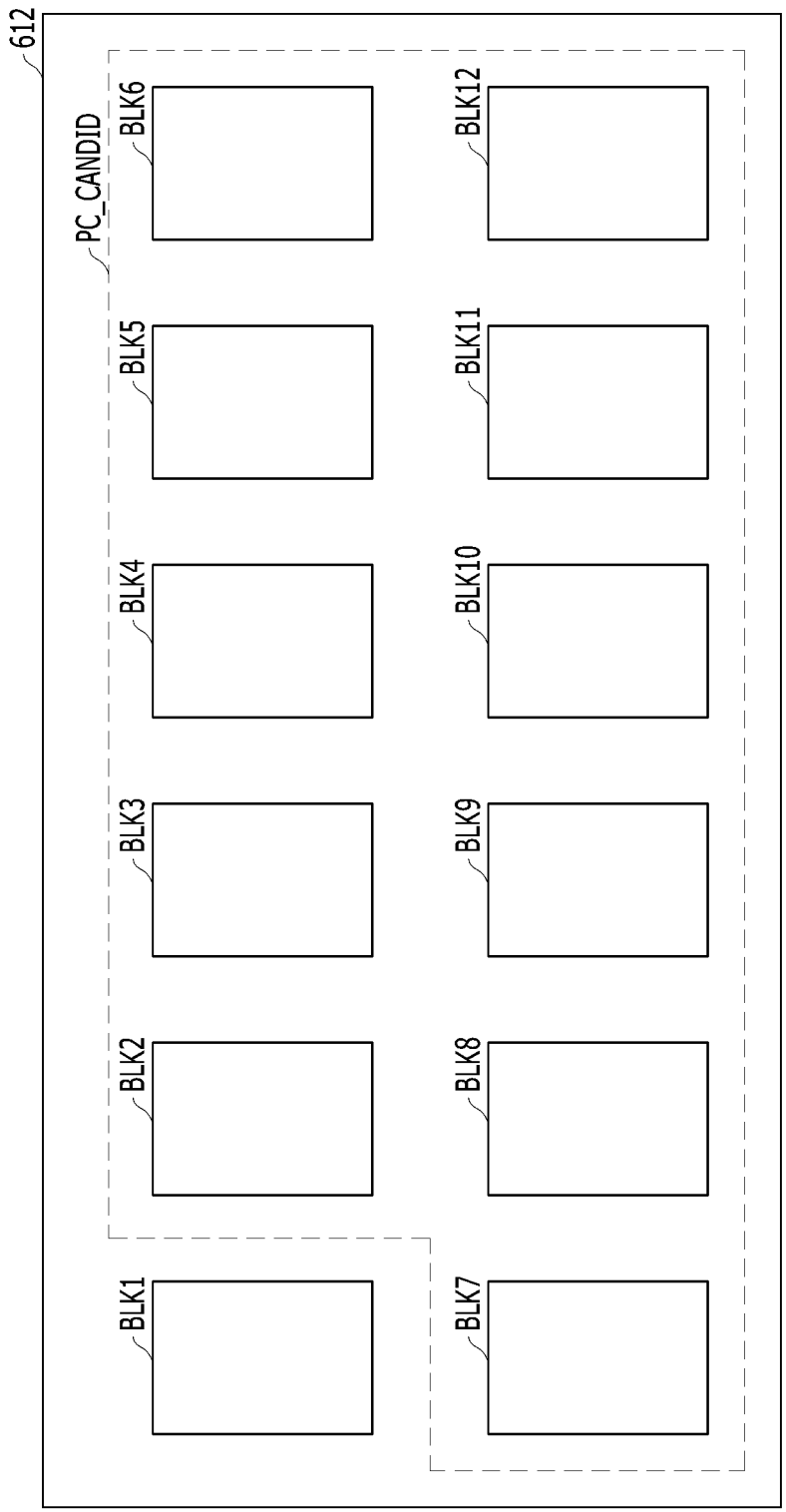
FIG. 7 illustrates an example of a plane including a plurality of memory blocks.

FIG. 7 shows an embodiment of a plane including a plurality of memory blocks. This plane is provided as an example in order to explain a phenomenon where a read error rapidly increases in a read operation performed first, using a default level of read voltages to a candidate block after performance of an issue-triggering operation. Referring to FIG. 7, an example of the zeroth plane 612 in FIG. 4 is shown to include first to twelfth memory blocks BLK1 to BLK12.

After a program operation or an erase operation (e.g., an issue-triggering operation) is performed on the first memory block BLK1 (which is one of the plurality of memory blocks BLK1 to BLK12 in the same plane 612), the memory system may perform a read operation to the second memory block BLK2, which is a memory block other than the first memory block BLK1 among the plurality of memory blocks BLK1 to BLK12. Hereinafter, the memory blocks other than the first memory block BLK1 among the plurality of memory blocks BLK1 to BLK12 may be considered to be a candidate block of issue occurrence candidate group PC_CANDID.

In plane 612, when a memory block is programmed or erased, threshold voltages of memory cells in another memory block can be temporarily fluctuated, so that an error is increased in a read operation (e.g., a default read operation) for memory cells in another memory block. As the memory device is highly integrated, memory blocks may be affected by a program voltage or an erase voltage which is supplied into a memory block adjacent to the memory blocks, because the program voltage or the erase voltage may have a higher level than the read voltages. Because of this phenomenon, the controller may avoid or reduce the error in read data obtained through the default read operation directly after the program or erase operation is performed to an adjacent memory block. When the error (e.g., the number of bit errors) increases in the default read operation and the default read operation fails, the controller may perform the read retry operation and/or an additional read operation. As a result, performance of the read operation may be substantially reduced.

The phenomenon where the read error rapidly increases may be temporary. For example, the read error may increase rapidly only in a default read operation performed first for each of the issue occurrence candidate groups PC_CANDID after the issue-triggering operation is performed. For example, after the issue-triggering operation is performed for the first memory block BLK1, a variety of errors may occur in a first default read operation for any one of the first to third pages corresponding to memory cells in the second memory block BLK2 (which is one of the issue occurrence candidate group PC_CANDID). However, after the default read operation is performed for any one of the first to third pages, error may be reduced in a second default read operation for another page among the first to third page in the second memory block BLK2.

Even though the memory system may use previously determined levels of read voltages in the first and second default read operations regarding two pages of the first to third pages in the second memory block BLK2, error levels of the default read operations regarding two pages may be different. For example, the error level of the second default read operation may drop more than that of the first default read operation. Although levels and the order of supply of the read voltages used in the first and second default read operations might not be adjusted or changed, it may be plausible that the number of bit errors in the second default read operation is less than that in the first default read operation. However, when many errors occur in any of the first and second default read operations, the memory system might not cure or correct any of LSB, CSB, and MSB data stored in the memory cells of the TLC block.

The above-described issue may be caused by a temporary shift or change of the threshold voltage distribution of memory cells in the issue occurrence candidate group PC_CANDID in the plane 612, when the issue-triggering operation has been performed for the first memory block BLK1 in the same plane 612. However, after any read operation for the memory cells in the issue occurrence candidate group PC_CANDID is performed, this temporary shift or change may be gone and the threshold voltage distribution of the memory cells can return. The read operation may restore the threshold voltage distribution regarding memory cells of a memory block in the issue occurrence candidate group PC_CANDID, from temporarily shifted one to a previously maintained one. For example, when the threshold voltage distribution regarding the second memory block BLK2 in the issue occurrence candidate group PC_CANDID is temporarily moved due to the issue-triggering operation, the threshold voltage distribution can be restored when the read operation is performed to any page in the second memory block BLK2.

Referring to FIG. 2, in the TLC memory block, the controller may use a plurality of read voltages to recognize a state of each memory cell, e.g., which state a threshold voltage of each memory cell belongs to among the plurality of states. For example, referring to operation S602 in FIG. 6, the controller may use the first to the seventh read voltages R1 to R7 to determine that a threshold voltage of each memory cell belongs to an erase state E or the first to the seventh program states P1 to P7. As described above, in a default read operation, the controller may use default levels of the read voltages, which may either be determined in a successful read operation among previous read operations or predetermined in a manufacturing procedure. However, because the default levels may be determined based on previous threshold voltage distribution regarding the memory cells before it is shifted or changed by the issue-triggering operation, the shift or change of the threshold voltage distribution may not be reflected in the default levels of the read voltages. As a result, read error may increase in the default read operation using the default levels of the read voltages performed on the issue occurrence candidate group PC_CANDID.

Figure 8A:
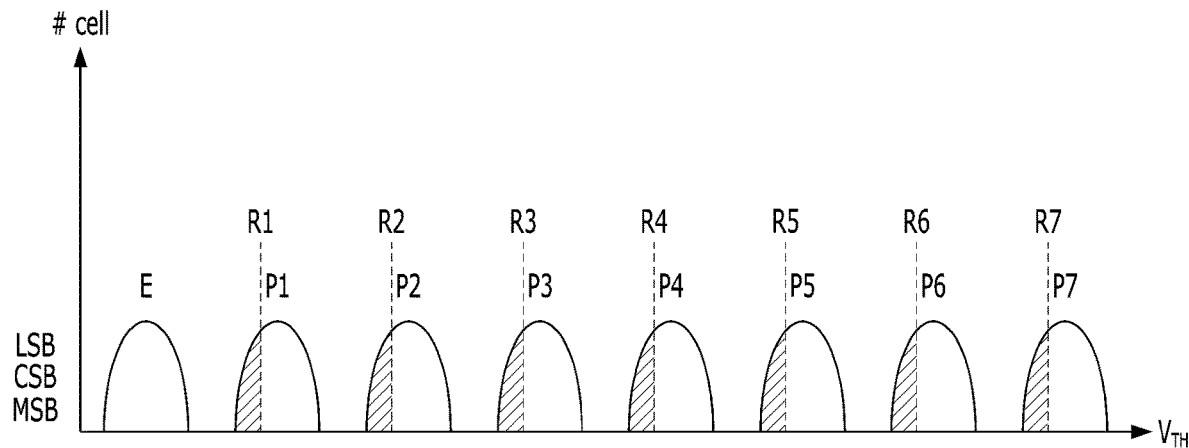
FIGS. 8A to 8C illustrate an example of a phenomenon where a threshold voltage distribution of memory cells is restored to a previous threshold voltage distribution after a read voltage is supplied to the memory cells.
Figure 8B:
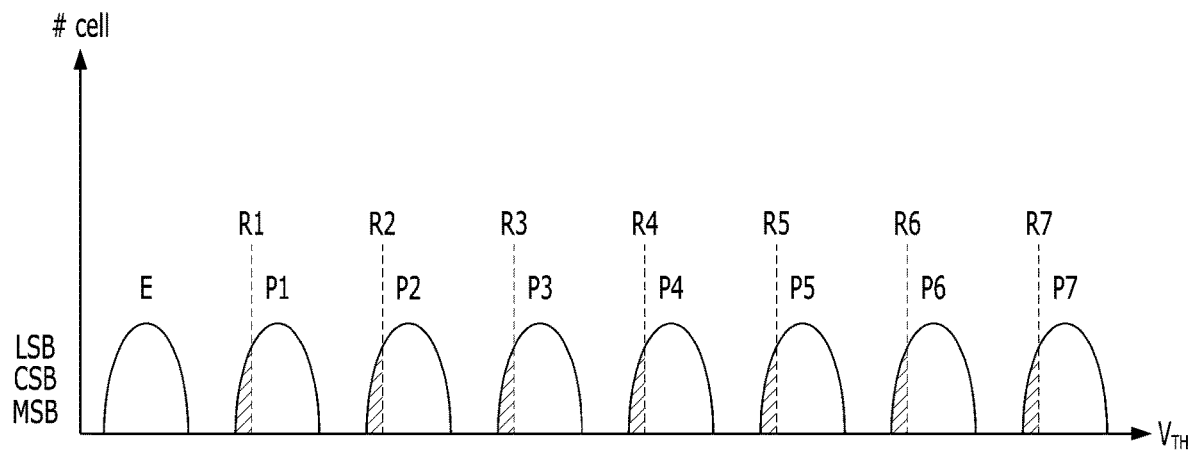
Figure 8C:
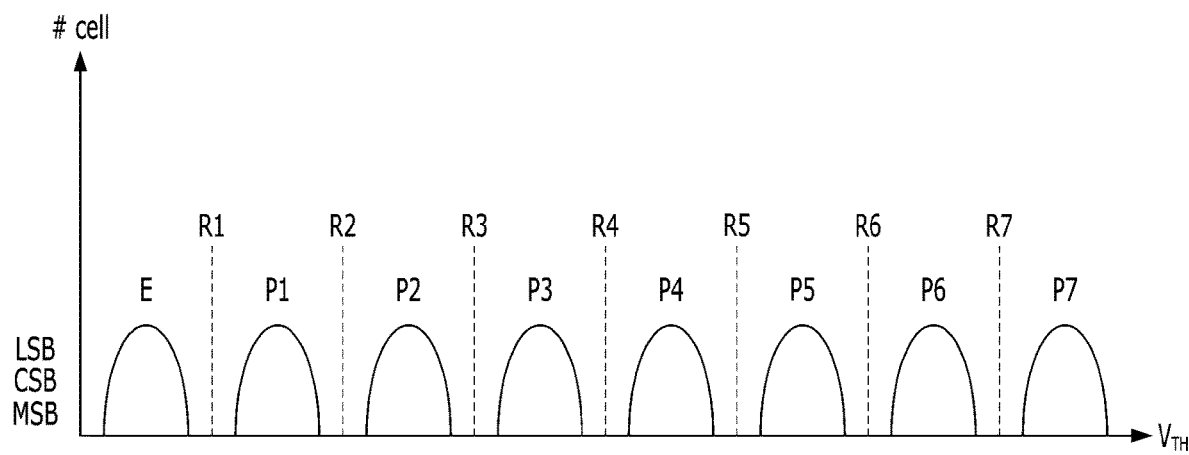

FIGS. 8A to 8C illustrate examples provided to explain a phenomenon where a threshold voltage distribution of memory cells, which is shifted according to an issue-triggering operation, is restored to a previous threshold voltage distribution after a read voltage is supplied to the memory cells. In these examples, it may be assumed that the controller receives a read command associated with a first page of the second memory block BLK2 after the issue-triggering operation is performed on the first memory block BLK1, as referenced in FIG. 7.

FIG. 8A shows an example of a first threshold voltage distribution regarding memory cells of the second memory block BLK2 (which is one of the issue occurrence candidate groups PC_CANDID) immediately after the issue-triggering operation is performed for the first memory block BLK1. The first memory block BLK1 and the second memory block BLK2 are included in the same plane and may be adjacent to each other. For convenience of description, it is assumed that the threshold voltage distribution regarding the memory cells of the second memory block BLK2 is originally identical with that shown in FIG. 5. In addition, the first to seventh read voltages R1 to R7 may have the same levels with the first to the seventh read voltages R1 to R7 shown in FIG. 5. The first to the seventh read voltages R1 to R7 may have default levels used for the default read operation.

Referring to FIG. 8A, as the first threshold voltage distribution is compared with the threshold voltage distribution shown in FIG. 5, the threshold voltage distribution corresponding to each of the erase state E and the first to the seventh program states P1 to P7 has been moved to the left, e.g., overall the threshold voltages VTH become lower after the issue-triggering operation is performed. A shift direction in which threshold voltage distributions are moved is only an example. In another example, some threshold voltage distributions may be moved to the left and other threshold voltage distributions may be moved to the right, after the issue-triggering operation is performed.

As described above with reference to FIGS. 5 and 6, the controller may use the third and the seventh read voltages R3 and R7 in response to a read command for the first page of the second memory block BLK2. A default read operation for the first page may be performed. As shown in FIG. 8A, when the threshold voltage distribution moves, data different from the original data may be output from at least some memory cells having a threshold voltage corresponding to an oblique line area. For example, as the threshold voltage distribution moves, a threshold voltage of some memory cells programmed with the third program state P3 becomes smaller than a level of the third read voltage R3. Thus, although a value of the LSB data programmed in the memory cell is '0', some memory cells are turned on when the third read voltage R3 is supplied, so that some bits of the LSB data stored in the memory cells can be read as the value of '1,' not '0.'

The controller may control the memory device to perform the read operation on the first page of the second memory block by first supplying the third read voltage R3 and then supplying the seventh read voltage R7 according to a set order. The threshold voltage distribution regarding the memory cells included in the second memory block BLK2 may be temporarily shifted or changed, like the first threshold voltage distribution according to the issue-triggering operation, as shown in FIG. 8A. Whenever a read voltage is supplied to the second memory block, the threshold voltage distribution may be restored close to the original threshold voltage distribution. For example, after the third read voltage R3 is supplied to the second memory block BLK2, a second threshold voltage distribution regarding the same memory cells included in the second memory block may be closer to the original threshold voltage distribution than the first threshold voltage distribution.

FIG. 8B shows an example of the second threshold voltage distribution regarding the memory cells included in the second memory block BLK2 after the third read voltage R3 is supplied to the second memory block BLK2.

After the third read voltage R3 is supplied into the second memory block BLK2, the threshold voltage distribution regarding the memory cells included in the second memory block BLK2 has shifted to the right, e.g., in the direction where the threshold voltage VTH increases. The second threshold voltage distribution shown in FIG. 8B become closer to the original threshold voltage distribution compared to the first threshold voltage distribution shown in FIG. 8A. The number of bit errors decreases, but an error may still occur when the seventh read voltage R7 is supplied to read the first page of the second memory block BLK2.

For example, data stored in the memory cells corresponding to the oblique line area in FIG. 8B may be read differently from the original data programmed therein. For example, even after the third read voltage R3 is supplied so that the threshold voltage distribution is entirely shifted to the right, some memory cells programmed with the seventh program state P7 have a lower level of threshold voltage than a level of the seventh read voltage R7.

Accordingly, although a bit value of the LSB data programmed in the memory cell has the value of '1', some memory cells corresponding to the oblique line area are turned on when the seventh read voltage R7 is supplied, so that the bit value of LSB data stored in the memory cells can be read as the value of '0.'

FIG. 8C illustrates an example of a third threshold voltage distribution regarding the memory cells included in the second memory block BLK2 after the seventh read voltage R7 is supplied into the second memory block BLK2.

After the seventh read voltage R7 is applied to the second memory block BLK2, the third threshold voltage distribution regarding the memory cells included in the second memory block BLK2 is closer to the original threshold voltage distribution than the second threshold voltage distribution shown in FIG. 8B. Referring to FIG. 8C, it is likely that the third threshold voltage distribution becomes very similar to the original threshold voltage distribution, and the threshold voltage distributions temporarily moved according to the issue-triggering operation can be restored after the third and seventh read voltages R3 and R7 are sequentially applied. Accordingly, when a default read operation to the first page of the second memory block BLK2 is performed directly after the issue-triggering operation is performed, a read error (e.g., the number of bit errors) may increase rapidly, but a read error may be reduced in another read operation performed to another page of the second memory block BLK2 after the default read operation to the first page is performed.

FIGS. 8A to 8C illustrate examples of threshold voltage distributions shifted or changed when the default read operation to the first page of the second memory block BLK2 is performed. Referring to FIGS. 8A to 8C, the threshold voltage distribution may be shifted or changed whenever a default read operation to the second page, another default read operation to the third page, or a default read operation to the first page is performed. For example, the threshold voltage distributions may be changed to be close to the original threshold voltage distribution whenever the read voltage is supplied. However, when a default read voltage is used in a read operation to any one of the first to third pages of the second memory block BLK2 directly after the issue-triggering operation is performed on the first memory block BLK1, the read error may increase rapidly due to the temporarily shifted threshold voltage distributions as shown in FIG. 8A.

Under these circumstances, the memory system may start the read retry operation. Because the read retry operation includes a plurality of read operations, the time for completing the read operation in response to a host request may be relatively long when the default read operation fails and the read retry operation is begun. Success or failure of the default read operation may be a factor that may be used for determining the performance of the read operation.

According to an embodiment, when an issue-triggering operation is performed to the first memory block BLK1, the controller 130 may consider memory blocks other than the first memory block BLK1 in the same plane as the issue occurrence candidate group PC_CANDID. When a read command associated with the second memory block BLK2 (which is one of the memory blocks included in the issue occurrence candidate group PC_CANDID) is input, the controller 130 can adjust a level of the read voltage based on a predetermined table so that the memory device 150 may be controlled to use an adjusted level of the read voltage for performing a default read operation to any page in the second memory block BLK2.

The probability of success of the default read operation can be increased by using a read voltage having the adjusted level, rather than the default read voltage without level adjustment of the read voltage. A read operation using a read voltage with an adjusted level may be performed when the threshold voltage distribution regarding memory cells in the second memory block BKL2 is shifted or changed according to the issue-triggering operation, performed in the first memory block BLK1 adjacent to the second memory block BLK2 in the same plane.

Figure 9:
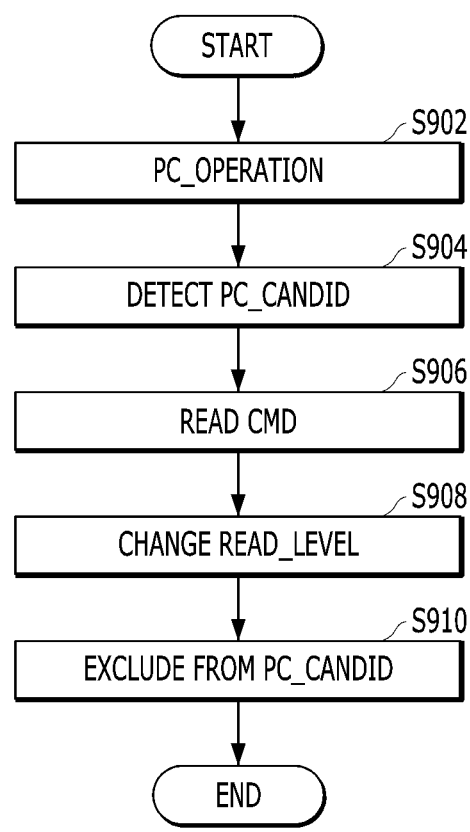
FIG. 9 illustrates a method for operating a memory system according to an embodiment.

FIG. 9 shows a method for operating a memory system according to an embodiment. The memory system may include any of the non-volatile memory devices according to embodiments as described herein.

In operation S902, the controller 130 may control the memory device 150 to perform an issue-triggering operation PC_OPERATION. The issue-triggering operation PC_OPERATION may include at least one of an erase operation or a program operation. For example, the controller 130 may control the memory device 150 to perform the issue-triggering operation to the first memory block BLK1, included in the zeroth plane 612 described with reference to FIG. 7, in response to a request input from the host 102.

In operation S904, the controller 130 may detect an issue occurrence candidate group PC_CANDID. The issue occurrence candidate group PC_CANDID may include memory blocks other than the first memory block BLK1, which the issue-triggering operation has been performed to in operation S902, within the same plane. For example, the controller 130 may recognize the second to the twelfth memory blocks BLK2 to BLK12 in the zeroth plane 612 shown in FIG. 7 as the issue occurrence candidate group PC_CANDID, when the issue-triggering operation is performed to the first memory block BLK1 in the zeroth plane 612. As described later, the controller 130 may record information, indicating whether the memory block is included in the issue occurrence candidate group PC_CANDID, in a flag bit assigned for each memory block. The controller 130 may establish the flag bit corresponding to each of the second to the twelfth blocks BLK2 to BLK12, for example, as a high logic value. Then, based on the flag bit corresponding to each memory block, the controller 130 can recognize whether a memory block associated with a read command is included in the issue occurrence candidate group PC_CANDID, after the read command is input.

In operation S906, the controller 130 may receive a read command input from the host 102. The controller 130 may search for a physical address associated with a logical address input along with the read command. The physical address may indicate any of the memory blocks in the issue occurrence candidate group PC_CANDID determined in operation S904. For example, the physical address associated with the logical address input along with the read command may indicate the second memory block BLK2 among the second to twelve memory blocks BLK2 to BLK12.

In operation S908, the controller 130 may adjust levels of the read voltages, used for a read operation corresponding to the read command received in operation S906, based on the predetermined table. According to an embodiment, referring to FIGS. 8A to 8C, the threshold voltages of at least some memory cells included in the issue occurrence candidate group PC_CANDID determined in operation S904 may be shifted or fluctuated by the issue triggering operation PC_OPERATION performed in operation S902.

The threshold voltage distribution regarding memory cells in the issue occurrence candidate group PC_CANDID may move temporarily. The table may be generated or determined through a test or a simulation performed based on performance of the memory system 110. Directly after performing the issue triggering operation, the controller 130 may use adjusted levels of read voltages to perform a default read operation to at least one memory block in the issue occurrence candidate group PC_CANDID, in order to increase success probability of the default read operation.

FIG. 10 shows an example of a table as described above according to an embodiment. Referring to operation S602 shown in FIG. 6, default levels of read voltages used in a default read operation may be determined based on a history (e.g., previous read operation successfully completed) among the previous read operations or a set level initially established through a manufacturing and testing procedure.

The controller 130 may control the memory device 150 to supply the read voltages having adjusted default levels obtained by multiplying or adding values to the default levels individually. The table 1002 according to an embodiment may show the values individually applicable to adjust a default level of each read voltage supplied into memory cells included in the memory device 150. In addition, the table 1002 may show that the values can be varied according to a program/erase cycle #PE_CYCLE.

For example, when receiving a read request associated with a first page of the second memory block BLK2 after the issue triggering operation is performed to the first memory block BLK1, the controller 130 may be configured to add a specific value DELTA3, which corresponds to a third read voltage R3 in the table 1002, to a default level of the third read voltage R3 and supply an adjusted level of the third read voltage R3 into memory cells of the second memory block BLK2, when a program/erase cycle #PE_CYCLE of the second memory block BLK2 is smaller than a first threshold value TH1. For example, the controller 130 may control the memory device 150 to supply the adjusted level of the third read voltage R3, not the default level of the third read voltage R3, into the memory cells of the second memory block BLK2 for performing a default read operation.

According to an embodiment, the adjusted level of the third read voltage R3 may be obtained by adding or multiplying the specific value DELTA3 established in the table 1002 to the default level of the third read voltage R3, which is determined based on the history or the initially set level. Thus, the controller 130 may use the third read voltage R3 having the adjusted level for a default read operation performed to any page in a specific memory block directly after the issue triggering operation performed to another memory block adjacent to the specific memory block.

The controller 130 may use another value corresponding to adjust a level for the third read voltage R3 when the program/eras cycle #PE_CYCLE of the second memory block BLK2 is greater than, or equal to, the first threshold TH1. In the table 1002, a different value DELTA' 3 may be added or multiplied to a default level of the third read voltage R3 in order to obtain an adjusted level of the third read voltage R3. Accordingly, the controller 130 may supply the third read voltage R3, which is not at the default level but at the adjusted level, into memory cells in the second memory block BLK2 in order to perform a read operation to the first page of the second memory block BLK2.

According to an embodiment, when receiving a read command regarding the first page of the second memory block BLK2 after determining the second memory block BLK2 as a candidate block of the issue occurrence candidate group PC_CANDID, the controller 130 may sequentially supply the third and the seventh read voltages R3, R7 having the adjusted levels based on the table 1002, rather than the default level previously determined, in order to perform a default read operation to the first page of the second memory block BLK2. By the way of example but not limitation, the third and seventh read voltages R3, R7 may have adjusted levels that are less than the default levels of the third and seventh read voltages R3, R7, individually. The adjusted level of the third and seventh read voltage R3, R7 may be different according to the program/erase cycle #PE_CYCLE of the second memory block BLK2.

According to another embodiment, in operation S908, the controller 130 may carry out a calculation based on a program/erase cycle and a set threshold. The calculation may be determined, for example, through a manufacturing and testing procedure and recorded in the memory device 150. The controller 130 may carry out the calculation based on the program/erase cycle and the set threshold to dynamically determine a value applicable to each read voltage.

As compared with a set value categorized or classified by a situation or a condition, the calculation may provide more optimized value to adjust or change a level of read voltage. The controller 130 may control the memory device 150 to perform a read operation based on the adjusted level of read voltage to any page of candidate blocks. By the way of example but not limitation, the calculation may be carried out based on the program/erase cycle as well as various parameters such as a data retention time of the second memory block BLK2.

FIG. 11 shows how the level of read voltages may be changed or adjusted according to an embodiment. The controller 130 may adjust or change the level of the read voltage based on an amount recorded in the table 1002 shown in FIG. 10 or through a calculation based on an operation state of the memory block where the read voltage is applied. According to an embodiment, the controller 130 may determine adjustment or change of the read voltage (used for performing a default read operation) through the aforementioned calculation and control the memory device, in order to perform the default read operation based on the adjusted level of the read voltage.

The adjustment may be performed based on a calculated value that corresponds to the operation state and a set value (Delta) recorded in the table 1002. The calculated value may be obtained by dividing a program/erase cycle (#PE_CYLCE) regarding a memory block to which a default read operation is performed by a threshold (TH) corresponding to each read voltage and inputting the resulting divided value into a Gaussian function. The threshold may be a positive or negative value. The output of the Gaussian function may be the maximum value among integers not greater than the input value of the Gaussian function.

For example, when a read command associated with a first page of the second memory block BLK2 is input after the second memory block BLK2 is determined as one of the issue occurrence candidate group PC_CANDID, the controller 130 may divide a program/erase cycle #PE_CYCLE of the second memory block BLK2 by a set threshold TH33 corresponding to the third read voltage R3. The divided value may then be input into a Gaussian function in order to obtain adjustment for changing a level of the third read voltage R3. In one embodiment, the controller 130 may subtract an output of the Gaussian function from a set value recorded in the table to determine the change of the third read voltage R3. The controller 130 may use the third read voltage R3 having the adjusted level to perform a default read operation to the second memory block BLK2, so that the probability of success of the default read operation may be increased.

When the program/erase cycle #PE_CYCLE of the second memory block BLK2 is smaller than the first threshold TH1, the controller 130 may determine an adjusted level of the third read voltage R3 based on the table 1002. The controller 130 may subtract a calculation result from a set value DELTA3 recorded in the table 1002 to determine an adjustment of the third read voltage R3.

The calculation may be carried out through a Gaussian function. For example, the controller may input a value, obtained by dividing the program/erase cycle #PE_CYCLE by a corresponding threshold TH33, to the Gaussian function. The controller 130 may add the adjustment to a default level of the third read voltage R3 in order to determine an adjusted level of the third read voltage R3. The controller 130 may control the memory device 150 in order to supply the adjusted level of the third read voltage R3 into memory cells of the second memory block BLK2, for purposes of performing a default read operation.

Further, when the program/erase cycle #PE_CYCLE of the second memory block BLK2 is greater than or equal to the first threshold TH1, the controller 130 may perform a calculation to obtain the adjustment of the third read voltage R3 like a previous case when the program/erase cycle #PE_CYCLE of the second memory block BLK2 is smaller than the first threshold TH1. But, a set value DELTA'3 recorded in the table 1002 and the corresponding threshold TH33' may be different from that used in the case when the program/erase cycle #PE_CYCLE of the second memory block BLK2 is smaller than the first threshold TH1.

In operation S910, the controller 130 may exempt a specific memory block from the issue occurrence candidate group PC_CANDID, when the default read operation using a read voltage having an adjusted level is performed to the specific memory block in operation S908. For example, after the controller 130 performs a default read operation using read voltages, which have been adjusted based on the table, for the second memory block BLK2, the second memory block BLK2 is excluded from the issue occurrence candidate group in the event a problem occurs in the second memory block BLK2. For example, the second memory block BLK2 may be excluded from the occurrence candidate group PC_CANDID. As will be described, the controller 130 may set the flag bit regarding the second memory block BLK2 to a low logic value, in order to exempt the second memory block BLK2 from the problem generation candidate group PC_CANDID.

FIG. 12 shows an embodiment of a method for determining whether a memory block is a candidate block based on a flag bit. For convenience of description, FIG. 12 illustrates an example of flag bits, each flag bit corresponding to each of the first to twelfth memory blocks BLK1 to BLK12 included in the zeroth plane PLANE0.

After controlling the memory device 150 to perform an issue triggering operation to the first memory block BLK1 included in the zeroth plane PLANE0, the controller 130 may determine the remaining memory blocks BLK2 to BLK12 except for the first memory block BLK1 in the zeroth plane PLANE0 as the issue occurrence candidate group PC_CANDID. The controller 130 may set flag bits corresponding to the second to the twelfth memory blocks BLK2 to BLK12 determined as the issue occurrence candidate group PC_CANDID as a high logic value. For example, as illustrated in FIG. 12, the controller 130 may set all the flag bits for the second to the twelfth memory blocks BLK2 to BLK12 as a high logic value, e.g., the value of '1'.

Thereafter, when a read command associated with the second memory block BLK2 is input from the host 102, the controller 130 may check the flag bit regarding the second memory block BLK2. When the flag bit of the second memory block BLK is the value of '1', the controller 130 can determine that the second memory block BLK is a candidate memory block included in the issue occurrence candidate group PC_CANDID. As described in operation S908 of FIG. 9, a level of read voltage may be changed or adjusted based on the table 1002.

As another example, after the flag bit is set as shown in FIG. 12 (because the issue triggering operation is performed in the first memory block BLK1), another command for another issue triggering operation to the second memory block BLK may be input from the host 102. In this case, the controller 130 may establish the flag bit regarding the second memory block BLK2 to the value of '0,' and the flag bit regarding the first memory block BLK1 to the value of '1.'

FIG. 13 shows an example of a flag bit which is changed after a memory block is exempted from the candidate block. More specifically, FIG. 13 shows examples of the flag bits regarding the memory blocks BLK1 to BLK12 included in the zeroth plane PLANE0, after the second memory block BLK2 is exempted from the problem generation candidate group PC_CANDID, in operation S910 referring to FIG. 10. The controller 130 may adjust a level of read voltage based on a table.

After using an adjusted level of read voltage to perform the default read operation to the second memory block BLK2, the controller 130 may exclude the second memory block BLK2 from the issue occurrence candidate group PC_CANDID. The controller 130 may set the flag bit regarding the second memory block BLK2 to a low logic value to indicate that the second memory block BLK2 is exempted from the issue occurrence candidate group PC_CANDID. For example, the controller 130 may set the flag bit regarding the second memory block BLK2 from the value of '1' (shown in FIG. 12) to the value of '0.'

According to an embodiment, after the controller 130 supplies a read voltage having a level adjusted based on the table into memory cells of the second memory block BLK2 determined as the issue occurrence candidate group PC_CANDID in order to perform a default read operation, the second memory block BLK2 may be excluded from the issue occurrence candidate group PC_CANDID.

As described above, a phenomenon where a read error (e.g., the number of bit errors) rapidly increases in a default read operation performed to the issue occurrence candidate group PC_CANDID directly after an issue triggering operation may be temporary. For example, after a specific memory block is determined as the issue occurrence candidate group PC_CANDID, a read error may rapidly increase only in a default read operation first performed thereto. But, in a second default read operation performed to the same memory block later, the read error may be reduced. The first and second read operations may refer, for example, to a case in which a read voltage having a default level, not an adjusted level, is supplied in operation S602 of FIG. 6.

In the second default read operation, a read error does not rapidly increase even if the read voltage having the default level, not the adjusted level based on the table 1202, is supplied into memory cells of the second memory block BLK2 after the first default read operation performed to the second memory block BLK2. After the first default read operation, the second memory block BLK2 may be excluded from the issue occurrence candidate group PC_CANDID. Accordingly, the controller 130 may use the read voltage having an adjusted level to the default read operation performed in the second memory block BLK2 first only, not for the second time or later. Thus, after the first default read operation, the controller 130 may supply the read voltage having a default level to the memory block where the first default read operation has been performed.

Figure 14A:
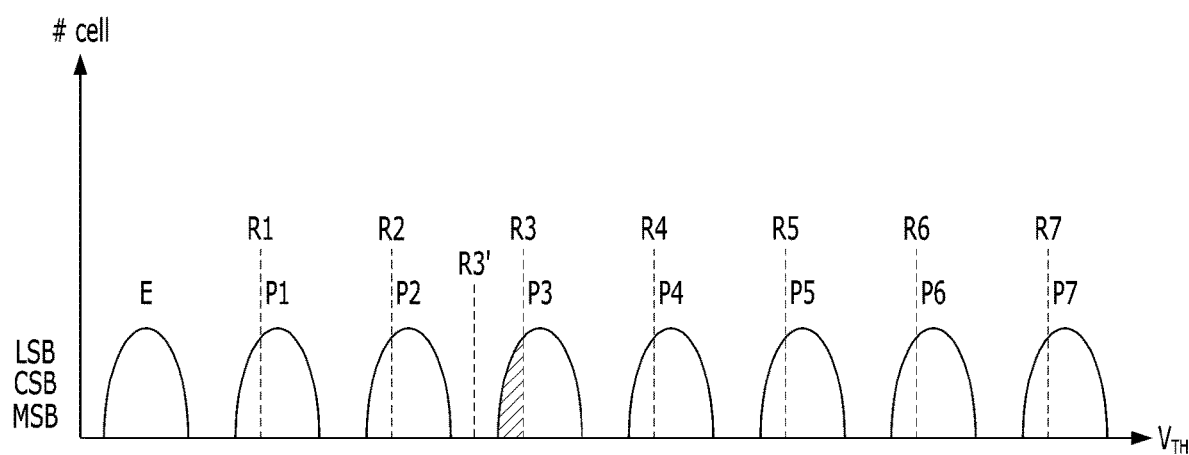
FIGS. 14A and 14B illustrate read voltages with levels that have been changed according to an embodiment.
Figure 14B:
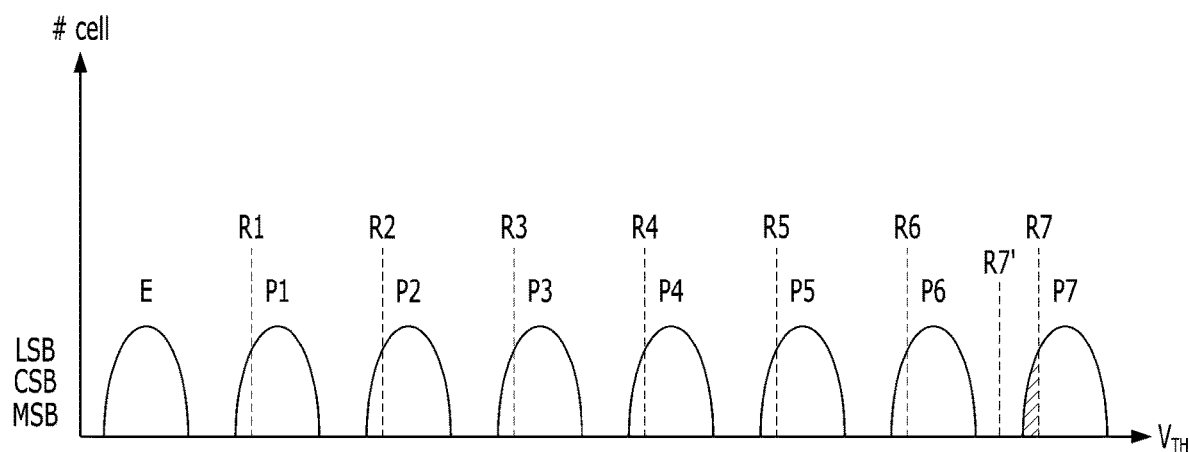

FIGS. 14A and 14B show read voltages, each voltage having a changed level according to an embodiment.

FIG. 14A shows an example of a first threshold voltage distribution regarding memory cells in the second memory block BLK2 which is determined as the issue occurrence candidate group PC_CANDID immediately after the issue triggering operation is performed to the first memory block BLK1 shown in FIG. 8A. In addition, the third read voltage R3' indicates a third read voltage having a level adjusted or changed according to an embodiment, as compared with the third read voltage R3 having a default level.

Referring to FIG. 14A, by comparing the first threshold voltage distribution with the original threshold voltage distribution shown in FIG. 5, it is evident that at least some threshold voltages belonging to each of the erase state E and the first to the seventh program states P1 to P7 have been moved to the left, which is a direction in which the threshold voltage VTH is lowered after the issue triggering operation is performed. The controller 130 may use, for purposes of performing a default read operation, the third read voltage R3' having the adjusted level to distinguish a third program shifted to the left from a second program shifted to the left. When a default read operation is performed by the third read voltage R3' having the adjusted level according to an embodiment, an error level might be reduced, e.g., a bit error occurring in a memory cell having a threshold voltage shifted in the oblique line area may be cured so that the default read operation can be completed successfully.

For example, the threshold voltages of some memory cells programmed with the third program state P3 may become lower than the third read voltage R3 having the default level as the threshold voltage distribution moves. But, in an embodiment, the third lead voltage R3" having the adjusted level may be lower than shifted threshold voltage distribution. Accordingly, when the third read voltage R3' is supplied into the memory cells corresponding to the oblique line area, the memory cell are turned off so that the LSB data stored in the memory cells can be normally read with the value of '0.'

FIG. 14B shows an example of a second threshold voltage distribution regarding memory cells included in the second memory block BLK2 after the third read voltage R3' having the adjusted level is supplied into the second memory block BLK2 according to an embodiment of the disclosure.

After the third read voltage R3' is supplied to the second memory block BLK, it can be seen that the threshold voltage distribution regarding the memory cells included in the second memory block BLK2 has shifted to the right, e.g., in a direction in which the threshold voltage VTH increases. The second threshold voltage distribution is closer to the original threshold voltage distribution, compared to the first threshold voltage distribution. But an error may still occur in the second threshold voltage distribution when using the seventh read voltage R7 having the default level to read the first page of the second memory block BLK2. According to an embodiment of the disclosure, the controller 130 controls the memory device 150 to supply a seventh read voltage R7' having a level adjusted or changed based on the table 1002 into the memory cells of the second memory block BLK2 to perform a default read operation.

The seventh read voltage R7' can reduce or avoid an error from memory cells corresponding to the oblique line area. For example, even after the threshold voltage distribution is shifted to the right by third read voltage R3', the threshold voltage of some memory cells programmed with the seventh program state P7 may still be lower than the seventh read voltage R7 having the default level. However, the seventh read voltage R7' having the adjusted level according to an embodiment may be lower than a threshold voltage of the memory cells corresponding to the oblique line area. Accordingly, using the seventh read voltage R7' having the changed level, the controller 130 may read LSB data stored in memory cells corresponding to the oblique line area without an error as the value of '1.'

When a program operation or an erase operation is performed to a first memory block, a threshold voltage distribution in a second memory block (included in the same plane as the first memory block) may be changed. According to an embodiment, the memory system may change a level of read voltages based on a preset table and a mathematical operation and may perform a read operation to the second memory block based on the read voltages having changed levels. The read voltages having the changed levels may be used in a default (e.g., the beginning) read operation, not a read operation which can be performed after a few false starts. Thus, it is possible to avoid or reduce a case when the default read operation fails and the memory system starts a read retry phase due to the change of the threshold voltage distribution.

While the disclosure illustrates and describes specific embodiments, it will be apparent to those skilled in the art in light of the present disclosure that various changes and modifications may be made without departing from the spirit and scope of the invention as defined in the following claims.

What is claimed is:

1. A memory system, comprising:
   a memory device including a plane that includes a plurality of memory blocks, each memory block including a plurality of memory cells, each memory cell capable of storing multi-bit data; and
   a controller configured to determine that a second memory block is a candidate block when an issue-triggering operation is performed for a first memory block, to adjust levels of read voltages when receiving a read command for data stored in the second memory block determined as the candidate block, and to control the memory device to supply adjusted levels of the read voltages to the second memory block to perform a read operation corresponding to the read command,
   wherein the second memory block and the first memory block are included in the same plane,
   wherein the issue-triggering operation includes a program operation or an erase operation, and
   wherein the controller is configured to control the memory device to perform a read retry operation when the read operation is failed.

2. The memory system according to claim 1, wherein:
   the controller is configured to adjust the levels of the read voltages based on a set table, and
   the set table includes information indicative of how much the levels of the read voltages are individually changed from default values of the read voltages.

3. The memory system according to claim 2, wherein the adjusted levels of the read voltages are individually obtained by adding changes determined based on the set table and the default values of the read voltages.

4. The memory system according to claim 2, wherein the adjusted levels of the read voltages are obtained by adding changes, individually determined based on the set table and a calculation result, to the default values of the read voltages.

5. The memory system according to claim 4, wherein the controller is configured to perform a Gaussian function based on a value obtained by dividing a program/erase cycle regarding the second memory block by a threshold established for the second memory block to obtain the calculation result.

6. The memory system according to claim 5, wherein the second memory block is exempted from the plurality of memory blocks determined as the candidate block.

7. The memory system according to claim 6, wherein the controller determines a flag bit for the second memory block as a second logical value to exempt the second memory block as the candidate block.

8. The memory system according to claim 1, wherein the controller determines that the second memory block is the candidate block based on a flag bit which is associated with the second memory block and which has a first logical value.

9. The memory system according to claim 1, wherein the controller is configured to control the memory device to supply default levels of the read voltages to a memory block associated with another read command to perform a read operation corresponding to the read command.

10. A method for operating a memory system, comprising:
    performing an issue-triggering operation for a first memory block among a plurality of memory blocks in a memory device, each of the plurality of memory blocks including a plurality of memory cells, each memory cell capable of storing multi-bit data;
    determining that a second memory block other than the first memory block among the plurality of memory blocks is a candidate block;
    receiving a read command associated for data stored in the second memory block determined as the candidate block;
    adjusting levels of read voltages which are applicable to the second memory block; and
    controlling the memory device to supply adjusted levels of the read voltages to the second memory block to perform a read operation corresponding to the read command,
    wherein the issue-triggering operation includes a program operation or an erase operation, and
    wherein the method further comprises controlling the memory device to perform a read retry operation when the read operation fails.

11. The method according to claim 10, further comprising:
    adjusting the levels of the read voltages based on a set table,
    wherein the set table includes information indicative of how much the levels of the read voltages are individually changed from default values of the read voltages.

12. The method according to claim 11, wherein the adjusting the levels of read voltages includes adding changes determined based on the set table to the default values of the read voltages, individually.

13. The method according to claim 11, wherein the adjusting the levels of read voltages includes adding changes, individually determined based on the set table and a calculation result, to the default values of the read voltages.

14. The method according to claim 13, wherein the adjusting the levels of read voltages includes performing a Gaussian function based on a value of dividing a program/erase cycle regarding the second memory block by a threshold established for the second memory block to obtain the calculation result.

15. The method according to claim 10, further comprising:
    exempting the second memory block from the candidate block.

16. The method according to claim 15, wherein the exempting the second memory block includes determining that a flag bit for the second memory block has a second logical value to exempt the second memory block from the candidate block.

17. The method according to claim 16, further comprising:
controlling the memory device to supply default levels of the read voltages to a memory block associated with another read command for performing a read operation corresponding to the read command.

18. The method according to claim 10, wherein determining that the second memory block other than the first memory block among the plurality of memory blocks is the candidate block includes:
determining whether the second memory block is the candidate block based on a flag bit which is associated with the second memory block and which has a first logical value.

* * * * *